United States Patent
Jot et al.

(10) Patent No.: US 10,243,534 B2
(45) Date of Patent: Mar. 26, 2019

(54) SPECTRAL CORRECTION OF AUDIO SIGNALS

(71) Applicant: DTS, Inc., Calabasas, CA (US)

(72) Inventors: Jean-Marc Jot, Aptos, CA (US); Richard J. Oliver, Calabasas, CA (US)

(73) Assignee: DTS, Inc., Calabasas, CA (US)

( * ) Notice: Subject to any disclaimer, the term of this patent is extended or adjusted under 35 U.S.C. 154(b) by 0 days.

(21) Appl. No.: 15/337,006

(22) Filed: Oct. 28, 2016

(65) Prior Publication Data

US 2017/0126194 A1   May 4, 2017

Related U.S. Application Data

(60) Provisional application No. 62/247,518, filed on Oct. 28, 2015.

(51) Int. Cl.
| | |
|---|---|
| H03G 5/00 | (2006.01) |
| H03G 9/00 | (2006.01) |
| G06F 3/16 | (2006.01) |
| H03G 5/02 | (2006.01) |
| H03G 5/16 | (2006.01) |

(52) U.S. Cl.
CPC ............ *H03G 9/005* (2013.01); *G06F 3/165* (2013.01); *H03G 5/005* (2013.01); *H03G 5/025* (2013.01); *H03G 5/165* (2013.01)

(58) Field of Classification Search
None
See application file for complete search history.

(56) References Cited

U.S. PATENT DOCUMENTS

| 7,746,964 B2 | 6/2010 | Nakano |
| 8,199,932 B2 | 6/2012 | Nakano |
| (Continued) | | |

FOREIGN PATENT DOCUMENTS

| CN | 103780214 A | 5/2014 |
| WO | WO-2015035492 A1 | 3/2015 |

OTHER PUBLICATIONS

"International Application Serial No. PCT/US2016/059385, International Search Report dated Jan. 17, 2017", 2 pgs.
(Continued)

*Primary Examiner* — James K Mooney
(74) *Attorney, Agent, or Firm* — Schwegman Lundberg & Woessner, P.A.

(57) ABSTRACT

Systems and methods to provide an audio spectral correction can be implemented in a variety of applications. Such systems and methods can include an equalizer design that uses efficient filter sections tuned with a closed form algorithm to give an accurate and intuitive frequency response with low complexity and minimal processing overhead. Embodiments can enable efficient and accurate control of reverberation time vs. frequency in artificial reverberators. Embodiments can enable efficient realization of a cascade combination of multi-band equalization functions as a single multi-band equalizer function, in which such functions can be expressed as graphic equalization functions using the same set of center frequencies as the cascade combination of multi-band equalization functions. Additional apparatus, systems, and methods are disclosed.

30 Claims, 21 Drawing Sheets

(56) References Cited

U.S. PATENT DOCUMENTS

| | | | |
|---|---|---|---|
| 2005/0254564 A1* | 11/2005 | Tsutsui | H03G 5/025 375/229 |
| 2006/0147057 A1 | 7/2006 | Aggarwal et al. | |
| 2012/0263311 A1 | 10/2012 | Neugebauer et al. | |
| 2015/0215703 A1 | 7/2015 | Paumier | |

OTHER PUBLICATIONS

"International Application Serial No. PCT/US2016/059385, Written Opinion dated Jan. 17, 2017", 7 pgs.

* cited by examiner

US 10,243,534 B2

SPECTRAL CORRECTION OF AUDIO SIGNALS

PRIORITY APPLICATION

This application claims the benefit of U.S. Provisional Application Ser. No. 62/247,518, filed on 28 Oct. 2015, which application is incorporated by reference herein in its entirety.

TECHNICAL FIELD

The present invention relates generally to apparatus and methods of processing of audio signals.

BACKGROUND

Graphic equalizers give listeners an intuitive way to modify the frequency response of an audio signal—simply set the sliders to visually represent the desired curve and the corresponding shape of audio filter frequency response will be invoked. At least, that is the implied promise of the technology. However, the actual measured response of the equalizer can reveal some surprises. Filter inaccuracy, boost/cut asymmetry, and unexpected nulls can disappoint both the eye and the ear.

An audio graphic equalizer is a multi-band audio filter that provides tunable amplitude control at a fixed set of frequencies spaced regularly along a logarithmic scale. The operator controls the level of each band individually, in order to correct a magnitude response variation or to create one intentionally. The standard control interface for the graphic equalizer is a set of sliders arranged in parallel, so the implied behavior is that the audio response curve will match the magnitude setting at each slider position. The degree to which this is realized will be referred to herein as the accuracy of the equalizer.

Accurate equalizers can be implemented with finite impulse response (FIR) filtering techniques, but that approach incurs a severe design tradeoff between computing resources and frequency resolution. When computing resources are at a premium, it is practical to use a more efficient filtering technique, often by cascading infinite impulse response (IIR) filter sections together. A typical approach is to use one second-order IIR filter section per equalizer band, configured as a peaking equalizer, also known as a presence or bell filter. A peaking filter for an audio graphic equalizer typically provides gain or loss (attenuation) at a specific center frequency, while having unity frequency response magnitude, or 0 dB gain, at frequencies far removed from the center frequency. The composite magnitude response of the peaking equalizer sections in series has the desired general behavior for an audio graphic equalizer; that is, its magnitude at each control frequency varies according to its individual setting. However, due to the interaction between the filter bands, the overall response is generally inaccurate and quite different from the operator's expectation.

Historically, the frequency responses of graphic equalizers created by combining IIR filter sections only roughly match the operator settings. There are theoretical reasons for these mismatches to occur, mainly related to the shape of the peaking filter response and the overlap between the frequency response curves of the individual equalization filter sections. Various methods have been proposed to improve the accuracy of an equalizer built up from peaking filters. They generally rely on iterative error minimization or heuristic rules that are not guaranteed to yield an optimal solution.

By way of example, FIGS. 1, 2, and 3 illustrate the responses of several different graphic equalizer implementations across a few different control configurations. The graphic equalizer (GEQ) curves GEQ A, GEQ B, and GEQ C were measured from three different popular commercial products. GEQ D curve is for an equalizer made from second-order IIR peaking equalizer sections cascaded together with the gain of each section set directly to its corresponding control value without any attempt to compensate for the interaction among the filter sections. In the GEQ having curve GEQ D, each peaking equalizer section is realized as a biquad IIR filter.

DRAWINGS DESCRIPTION

DETAILED DESCRIPTION

In the following description of embodiments of an audio spectral correction system and method reference is made to the accompanying drawings. These drawings show, by way of illustration and not limitation, specific examples of how embodiments of the audio spectral correction system and method may be practiced. These embodiments are described in sufficient detail to enable those skilled in the art to practice these and other embodiments. Other embodiments may be utilized, and structural, logical, electrical, and mechanical changes may be made to these embodiments. The various embodiments are not necessarily mutually exclusive, as some embodiments can be combined with one or more other embodiments to form new embodiments. The following detailed description is, therefore, not to be taken in a limiting sense.

Embodiments of an audio spectral correction system and method can include an equalizer design that uses efficient IIR filter sections tuned with a closed form algorithm to give an accurate and intuitive frequency response with low complexity and minimal processing overhead. The qualities of the embodiments of these systems and methods are ideal for implementing a graphic equalizer for audio. Additionally, embodiments of systems and methods, as taught herein, can enable efficient and accurate control of reverberation time vs. frequency in artificial reverberators.

Because of their accurate gain control property, embodiments of systems and methods can provide efficient realization of a cascade combination of multi-band equalization functions by lumping them into a single multi-band equalizer function. With combination provided into a single multi-band equalizer function, such functions can all be expressed as graphic equalization functions using the same set of center frequencies.

It should be noted that alternative embodiments are possible, and steps and elements discussed herein may be changed, added, or eliminated, depending on the particular embodiment. These alternative embodiments include alternative steps, alternative elements that may be used, and structural changes that may be made.

I. System and Operational Overview

Figure 4:
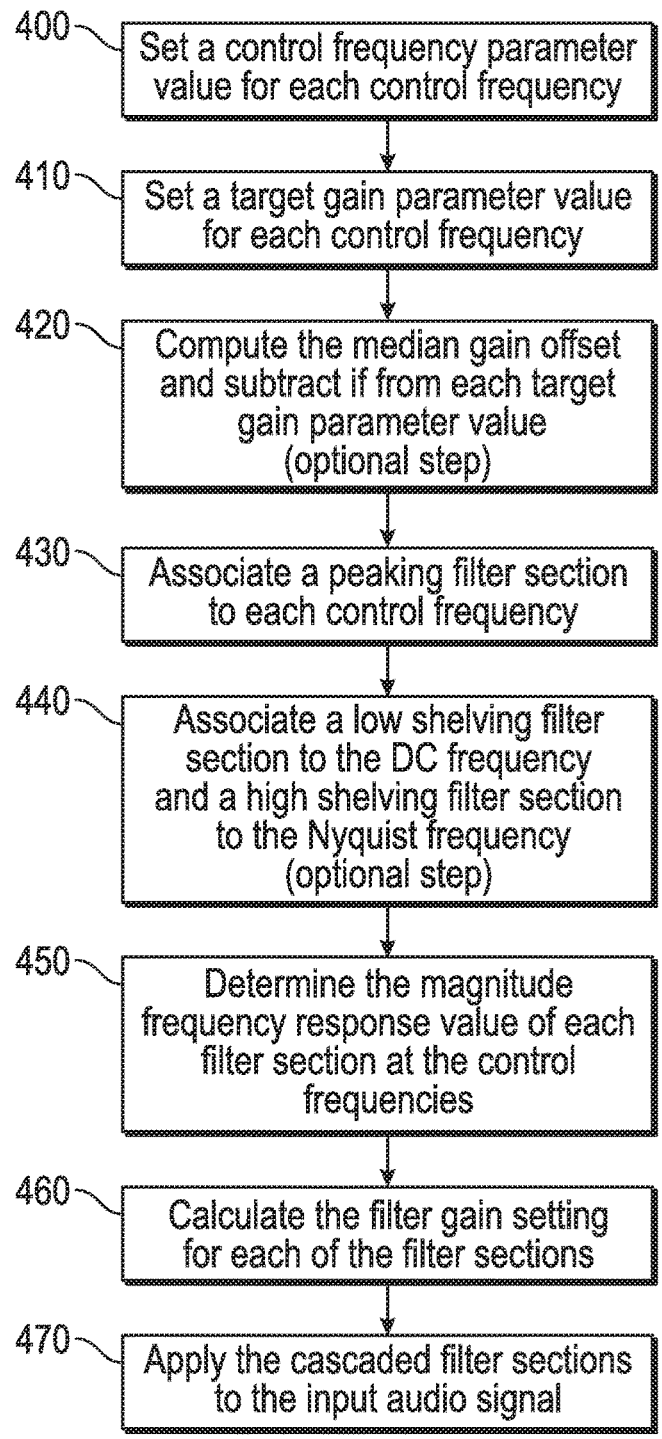
FIG. 4 is a flow diagram illustrating general operation of an example audio spectral correction system and method, and implementation of the multi-band equalizer, in accordance with various embodiments.

FIG. 4 is a flow diagram illustrating features of a general operation of embodiments of an example audio spectral correction system and method and implementation of a multi-band equalizer, in general, each action set forth in FIG. 4, except 420, 440, 460 and 470, is repeated once for each elementary filter. Elementary filters are cascaded together in the last step to form the multi-band equalizer. It should be noted that in FIG. 4 the rounded boxes represent optional actions. The first optional action is whether to apply a median gain modification and the remaining optional actions include implementing shelving filters. Typically, shelving filters are implemented to cut or boost all frequencies equally above or below a cutoff point. A high shelving filter is intended to be implemented such that all frequencies above a cutoff frequency may be cut or boosted without substantially altering any frequencies below this cutoff frequency. A low shelving filter is intended to be implemented such that all frequencies below a cutoff frequency may be cut or boosted without substantially altering any frequencies above this cutoff frequency. The process can begin with setting the frequency and target gain parameters for each band, continues with gain modification actions to compensate for interaction among the bands, and may end with the application of the gain-adjusted filters to the audio signal.

Referring to FIG. 4, the process can begin by setting a control frequency parameter value, $c_n$, for each control frequency (box 400). Next, a target dB gain parameter value, $G_n$, can be set for each control frequency (box 410). Optionally, embodiments can then include a computation of a median gain offset and then subtract that offset from each $G_n$ (box 420).

Embodiments of such an audio spectral correction system can then associate a peaking filter section, $H_n$, with each control frequency (box 430). In an optional action, a lower shelving filter section $H_o$ can be associated to the DC frequency and a high shelving filter section $H_{N+1}$ can be associated to the Nyquist frequency (box 440). The method then can include determination of a magnitude frequency response value of each filter section at the N control frequencies, $c_n$ (box 450) for a reference value of the filter section's dB gain setting, $K_n$ (for instance: 1 dB).

Embodiments of such methods can then include calculation of a corrected filter gain setting, $K_n$, for each of the N filter sections (box 460). As part of this calculation, in an optional action, two filter gain settings, $K_o$ (DC) and $K_{N+1}$ (Nyquist), can be calculated for shelving filter sections. The cascaded filter sections can be applied to the input audio signal and a modified, spectrally-corrected audio signal can be output (box 470). In various embodiments, methods can include features of the method of FIG. 4 operating on proportional filter sections (including, for instance proportional peaking filter sections and/or proportional shelving filter sections, as described below). An audio filter (or equalizer or spectral corrector) having a 'gain' or 'strength' control parameter whose effect is to scale the dB magnitude frequency response of the filter by a frequency-independent factor is herein qualified as 'proportional'.

II. System and Operational Details

II.A. Proportional Peaking Filter Section

An entire equalizer (EQ) may include a set of proportional filters cascaded together to form a single equalization filter. For example, an entire equalizer (EQ) may include a set of second-order IIR peaking filters cascaded together to form a single higher-order equalization filter. If desired, shelving filters can be included to modify the response at the low and high ends of the spectrum, to offer control over the response near DC and the Nyquist frequency. For stereo or multi-channel audio processing, an identical filter with identical parameter settings but separate state information can be used for each channel.

Figure 5:
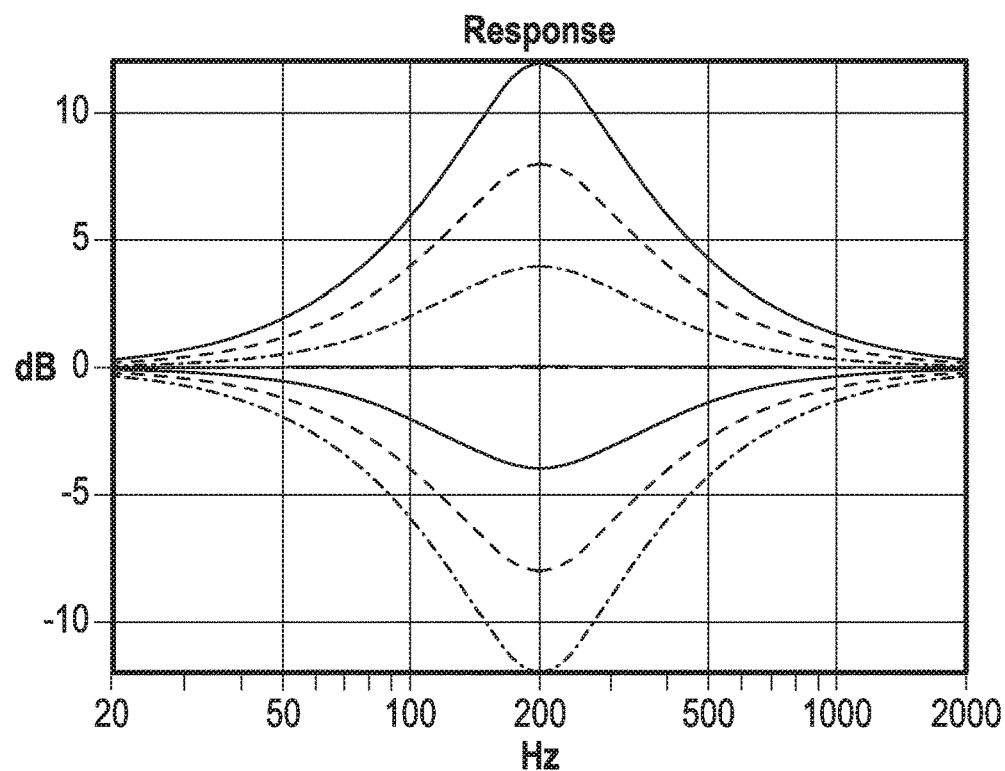
FIG. 5 illustrates proportional and symmetric gains of each peaking filter of example audio spectral correction systems and methods, in accordance with various embodiments.

Each peaking filter can be realized as a second order IIR filter having three control parameters that can be adjusted as part of the overall equalizer design: center frequency, quality factor, and gain. As illustrated in FIG. 5, for an embodiment using peaking filters, each proportional peaking filter has two important properties. First, its magnitude has nearly uniform scaling in response to the gain setting when viewed on a logarithmic (e.g., decibel) scale. Second, it has symmetric boost/cut behavior, meaning that two such filters with identical design parameters except for reciprocal gain will have magnitude responses that are mirror images around 0 dB on a log scale. It also means that those two filters cascaded together wilt have a combined flat response of 0 dB across the spectrum.

Note that uniform scaling is the property which makes the peaking filter "proportional," meaning that any change to the gain parameter will modify the gain at all frequencies by substantially the same scale factor. Also note that, in the embodiment described b low, the filters are not perfectly proportional, but the non-uniform response occurs mainly at frequencies far enough removed from the center frequency that the response is small and has a minimal impact on the overall equalizer's accuracy.

Denoting a biquadratic filter's transfer function as:

$$H(z) = \frac{b_0 + b_1 z^{-1} + b_2 z^{-2}}{a_0 + a_1 z^{-1} + a_2 z^{-2}},$$

a proportional peaking filter's coefficients are derived as follows:

$$\omega_0 = \frac{2\pi c_0}{F_s} \quad c_0 = \text{center frequency, } F_s = \text{sample rate}$$

$$A = 10^{\frac{g_0}{40}} \quad g_0 = \text{gain in decibels}$$

$$\alpha = \frac{\sin(\omega_0)}{2A q_0} \quad q_0 = Q \text{ factor}$$

$$r = \frac{1}{1+\alpha}$$

$$b_0 = r(1 + A^2 \alpha)$$

$$b_1 = -2r\cos(\omega_0)$$

$$b_2 = r(1 - A^2 \alpha)$$

$$a_0 = 1$$

-continued $$a_1 = b_1$$

$$a_2 = r(1 - \alpha).$$

II.B. Band Control Frequencies

Graphic equalizers traditionally have control frequencies or "bands" which are spaced evenly along a logarithmic frequency scale. For example, the control frequencies might be spaced one octave apart for a 10-band equalizer or three per octave for a "third octave" 30-band equalizer. Typical graphic equalizers have between five and thirty frequency bands. The choice of logarithmic spacing is psycho-acoustically justified for audio applications.

Embodiments of audio spectral correction systems and methods, as taught herein, do not place any particular limitation on the number or location of control frequencies. The choice of logarithmic spacing is natural for audio purposes and facilitates quality factor selection, as described below. In various embodiments, systems and methods, as taught herein, can be used for designing and/or implementing more general multiband parametric equalizers.

For illustrative and pedagogical purposes, in the following description two sets of control frequencies are chosen to use as examples of graphic equalizers in some of the discussions herein:

freq $Hz_{5Band}$={100, 316.228, 1000, 3162.28, 10000} freq $Hz_{10Band}$={31.25, 62.5, 125, 250, 500, 1000, 2000, 4000, 8000, 16000}

In an example, once the set of control frequencies is selected, one peaking filter can be assigned per frequency band with its center frequency set directly to the value specified for that band.

II.C. Quality Factor

Figure 6:
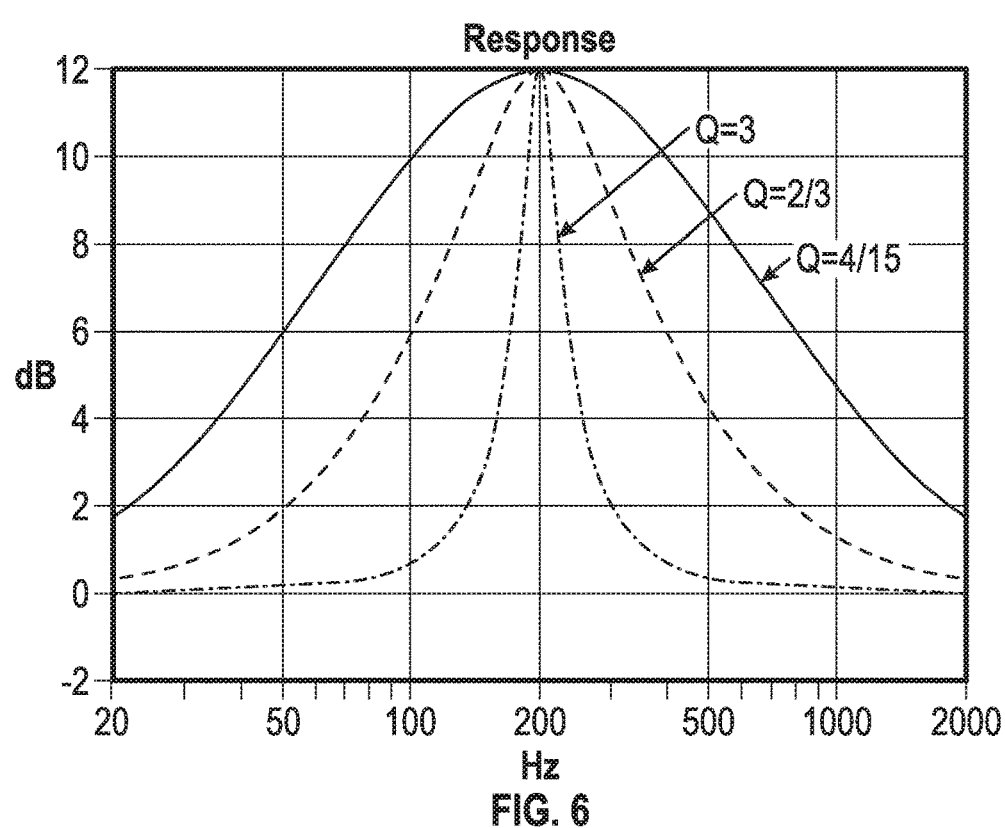
FIG. 6 illustrates impact of the quality factor for peaking filter sections of example systems and methods, in accordance with various embodiments.

The quality factor determines the bandwidth of a peaking filter's magnitude response. It is more commonly known as the filter's factor or simply Q. As illustrated in FIG. 6, a higher Q setting results in a narrower response and lower Q results in a wider response. The bandwidth for a peaking filter is defined herein as the number of octaves between midpoint (dB gain/2) gain frequencies. In other words, the points above and below the center frequency for which the response is half the number of dB as it is at the center frequency. The quality factor, Q, relates to bandwidth, BW, and normalized center frequency, $w_0$, as follows:

$$\frac{1}{Q} = 2\sinh\left(\frac{\ln(2)}{2} \cdot BW \cdot \frac{w_0}{\sin(w_0)}\right).$$

In a proportional peaking filter, the bandwidth, BW, and quality factor, Q, are not affected by a change in the peaking filter's gain setting.

Figure 7A:
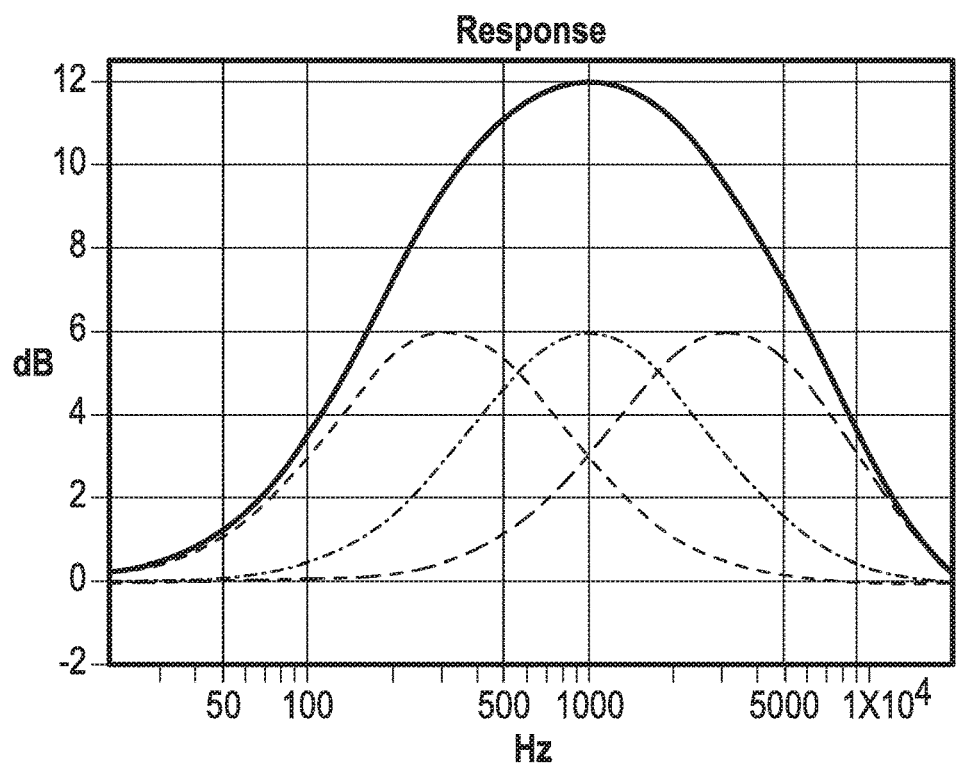
FIGS. 7A and 7B illustrate combining low quality factor vs. high quality factor filters, in accordance with various embodiments.
Figure 7B:
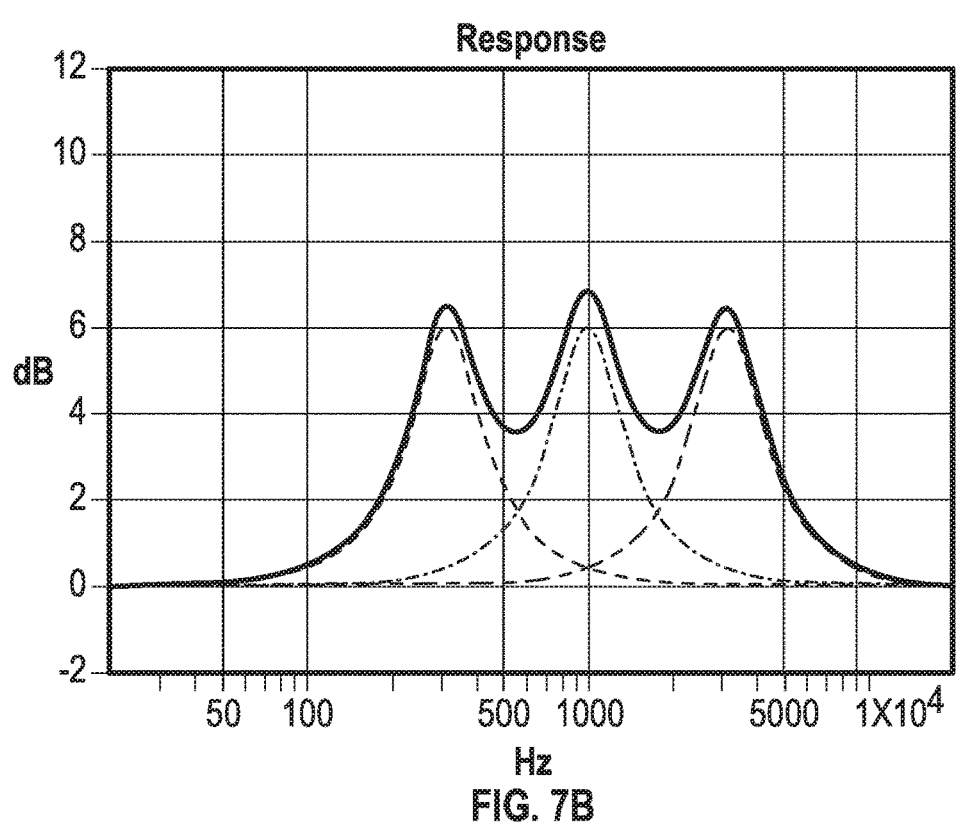

For a graphic EQ having logarithmic center frequency spacing, the Q factor can be set to the same value for all the peaking filter sections. The remaining question, then, is what an appropriate Q factor setting is for a given frequency spacing. As illustrated in FIGS. 7A and 7B, with low Q and low resolution, the filter overlap causes gain buildup in the composite response. With high Q and high resolution, the filter overlap is small and the composite response exhibits ripple.

For the example designs provided in this description for illustration purposes, the Q factors were iteratively tuned according to the following criterion. First, set two adjacent control values to the same gain setting and all others to 0 dB. Second, adjust their shared Q factor so that the response between the two frequencies is as flat as possible, meaning it is as small as possible without creating a dip in the response between the two control frequencies.

Figure 8A:
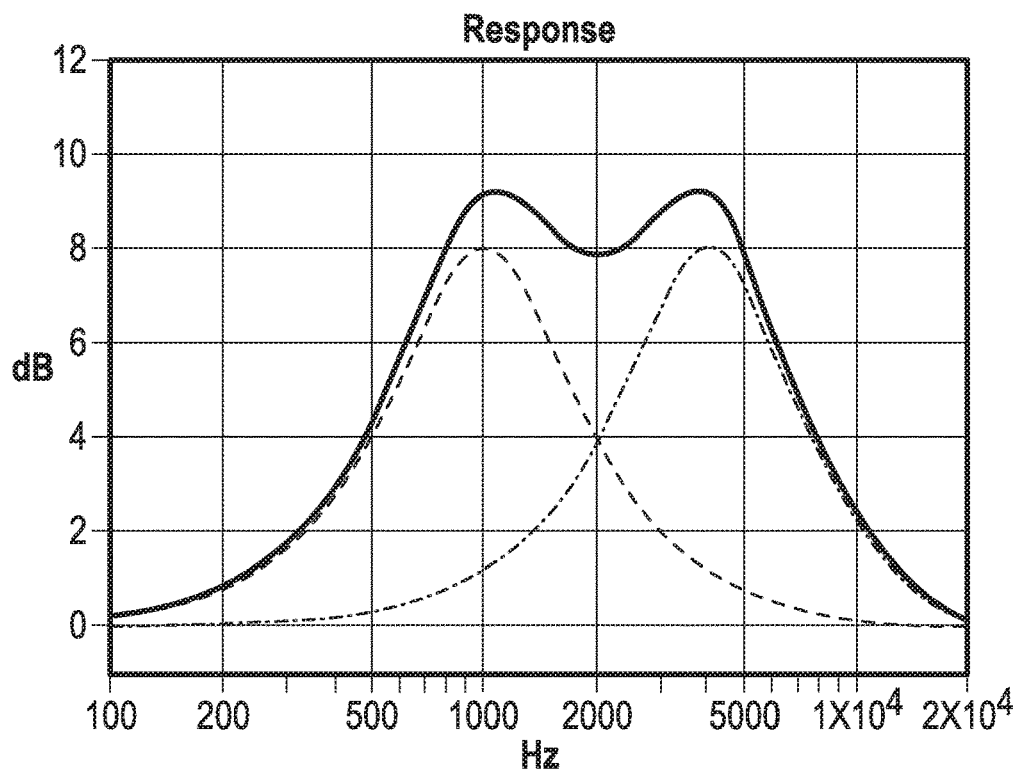
FIGS. 8A and 8B illustrate a quality factor for half gain at midpoint vs. a quality factor for flat top, in accordance with various embodiments.
Figure 8B:
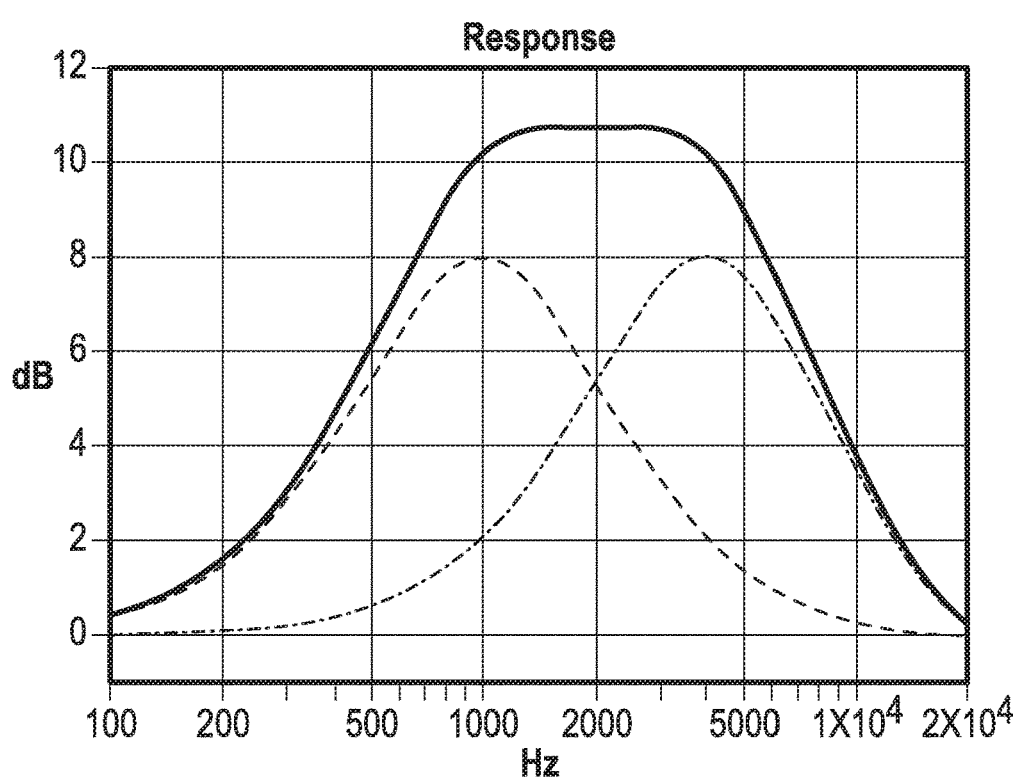

FIGS. 8A and 8B illustrate the Q factor for half gain at midpoint vs. the Q factor for flat top. FIG. 8B illustrates the above second criterion, namely adjusting the shared Q factor so that the Q factor is as small as possible without creating a dip in the response between the two control frequencies.

The resulting Q factor values for a 5-band equalizer and a 10-band equalizer in the example are:

$$Q_{5Band} = 0.52$$

$$Q_{10Band} = 0.98.$$

In alternative embodiments, which are illustrated in FIG. 8A, the Q factor may be set so that each section has half the set gain at the point where the individual responses cross. It is observed that the former method results in a smoother overall response across a variety of control settings, while the latter alternative method results in a "droopy" response with more ripple.

It should be noted that there is a tradeoff when choosing Q factors for a generalized multiband parametric equalizer, as opposed to a graphic equalizer with fixed, logarithmically spaced control frequencies. Since each peaking equalizer has a response that spreads equally above and below its center frequency, a dilemma presents itself when the adjacent frequencies are close on one side and far on the other. In particular, the closely spaced frequency would suggest a high Q factor, while the far spacing would suggest a low Q factor. Opting for a high Q will preclude control over the larger frequency gap, while opting for a low may result in large internal gains for the closely spaced bands.

II.D. Proportionality and Linearity

Figure 9:
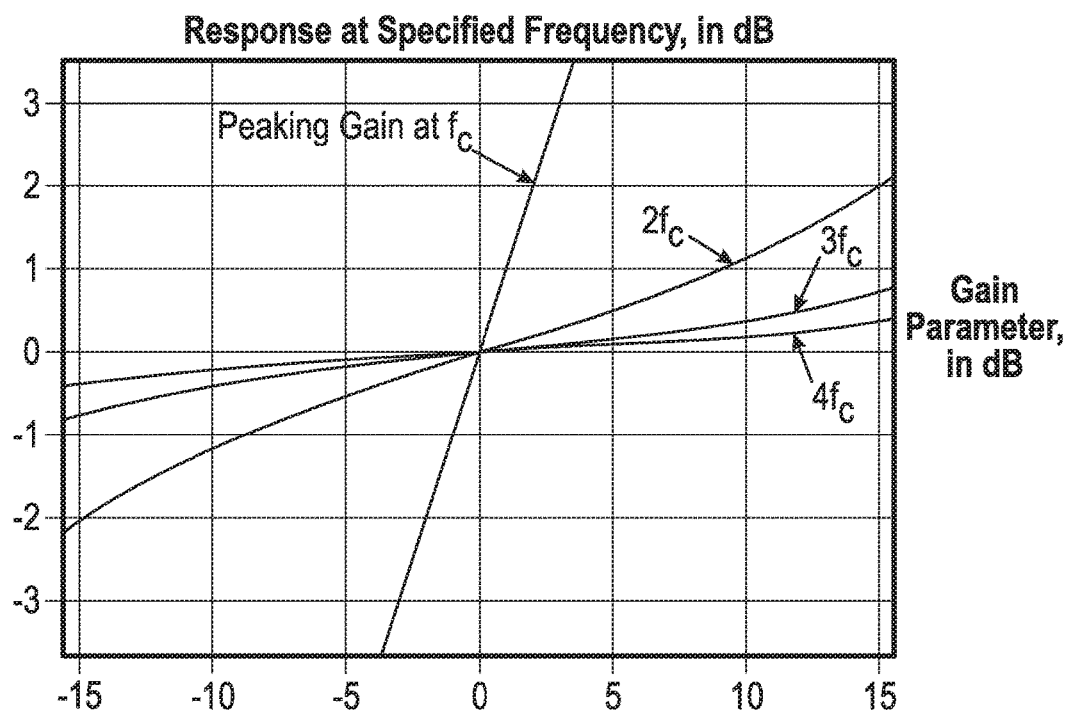
FIG. 9 illustrates the center gain vs. the skirt gain for a quality factor equal to 2.0, in accordance with various embodiments.

For a proportional peaking filter, the magnitude response at any fixed frequency should vary linearly with the filter's gain parameter. For a peaking filter design used in a number of embodiments, this is strictly true only at the filter's center frequency and at its band-edge frequencies (the midpoint (dB gain/2) gain frequencies). At other frequencies, the design is close to proportional, but some nonlinearity can be seen at frequencies far from the center frequency. FIG. 9 illustrates the center gain vs. the skirt gain for a Q factor equal to 2.0. Curves are shown for $f_c$, $2f_c$, $3f_c$, and $4f_c$. In practical terms, the skirts of each peaking filter section far away from its center frequency will have slightly more gain than required.

II.E. Proportional Shelving Filter Section

Peaking filter sections have a magnitude response of 0 dB at DC and the Nyquist frequency, no matter how their parameters are adjusted. Often it is desirable to extend a graphic equalizer's gain control to these frequencies with a low shelving filter for DC and a high shelving filter for the Nyquist frequency.

Figure 10:
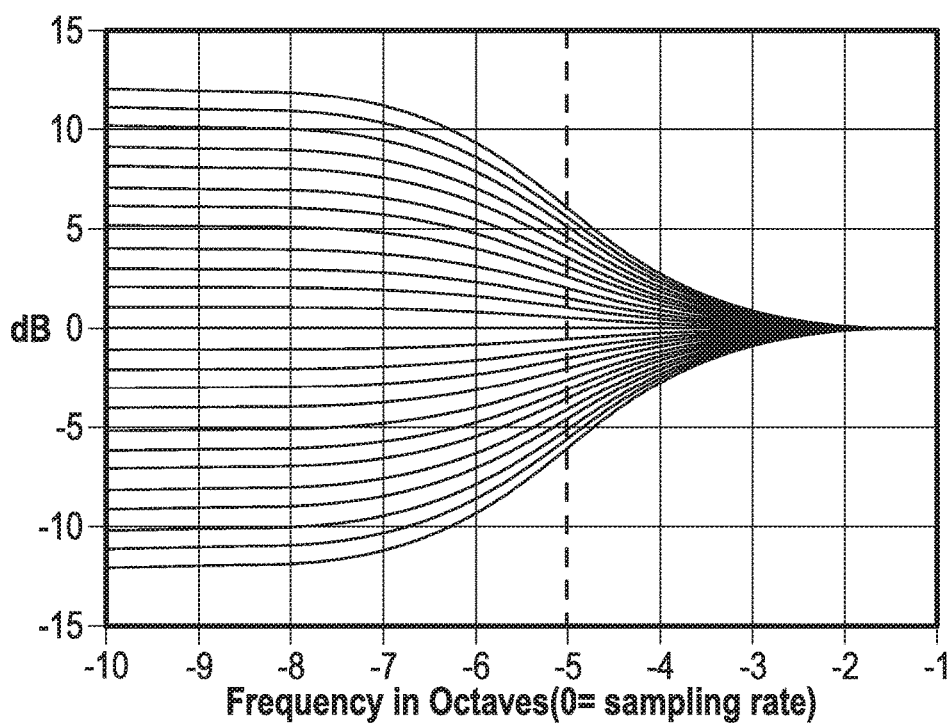
FIG. 10 illustrates the transfer function of a proportional 1st-order low-shelving filter section, in accordance with various embodiments.

The transfer function of a proportional 1st-order low-shelving filter section, as illustrated in FIG. 10 adjusting gain k while keeping the cross-over frequency constant. The transfer function is given by:

$$\tilde{H}_1(z) = \frac{(t\sqrt{k} + 1) + (t\sqrt{k} - 1)z^{-1}}{(t/\sqrt{k} + 1) + (t/\sqrt{k} - 1)z^{-1}},$$

where $$k = 10^{\frac{g_0}{20}}, g_0 = \text{gain in decibels}$$

$$t = \tan(\omega_O/2), \omega_O = \text{cross-over frequency.}$$

With the same parameter values, the transfer function of a proportional 1st-order high-shelving filter section is given by:

$$\tilde{H}'_1(z) = \frac{(t\sqrt{k} + k) + (t\sqrt{k} - k)z^{-1}}{(t\sqrt{k} + 1) + (t\sqrt{k} - 1)z^{-1}}.$$

The transfer function for a 2nd-order shelving filter section is given by:

$$H(z) = \frac{b_0 + b_1 z^{-1} + b_2 z^{-2}}{a_0 + a_1 z^{-1} + a_2 z^{-2}},$$

where the filter coefficients are derived as follows:

$h = 1$ for low shelf, $h = -1$ for high shelf $$\omega_0 = \frac{2\pi f_0}{F_s}$$

where $f_0$=shelf midpoint frequency, $F_s$=sample rate $$A = 10^{\frac{g_0}{40}} \ g_0 = \text{gain in decibels}$$

$$\alpha = \frac{\sin(\omega_0)(2+Q)\sqrt{(g+1)\left(\frac{1}{Q}-1\right) + 2A}}{2Q}$$

$$r = \frac{1}{(A+1) + h(A-1)\cos(\omega_0) + \alpha}$$

Figure 11:
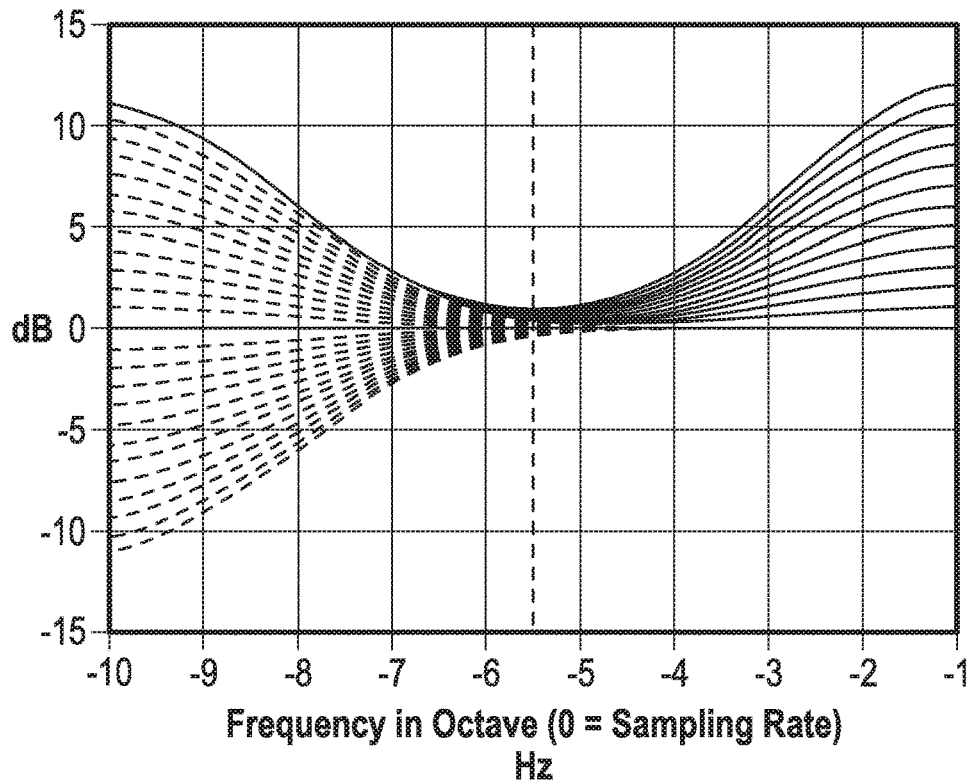
FIG. 11 illustrates the transfer function of a proportional 1st-order shelving filter section cascaded with a proportional 1st-order high-shelving filter section, in accordance with various embodiments.

$b_0 = rA((A+1) - h(A-1)\cos(\omega_0) + \alpha)$ $b_1 = rh2A((A-1) - h(A+1)\cos(\omega_0))$ $b_2 = rA((A+1) - h(A-1)\cos(\omega_0) - \alpha)$ $a_0 = 1$ $a_1 = -rh2((A-1) + h(A+1)\cos(\omega_0))$ $a_2 = r((A+1) + h(A-1)\cos(\omega_0) - \alpha).$ II.F. Dual Shelving Equalizer As illustrated in FIG. 11, a cascade of two shelving filters (low-shelving and high-shelving) can be used as a 3-band parametric equalizer or bass/treble tone control with adjustable cross-over frequencies, which may be implemented as a biquadratic IIR filter. FIG. 11 illustrates the transfer function of a proportional 1st-order low-shelving filter section cascaded with a proportional 1st-order high-shelving filter section.

As seen in FIG. 11, the gain of the dual-shelving equalizer at the middle frequency (indicated by a vertical dotted line) does not exactly reach 0 dB if the high and low-shelving gains are not mutually reciprocal. This can be remedied by introducing a global gain scaling factor (adding a frequency-independent dB gain K) and adjusting the low and high shelving gains to obtain specified gain values at DC and Nyquist. A closed-form solution to this problem can be derived by taking advantage of the proportionality property of the shelving filters, as described below.

Denote respectively $C_l(f)$, $G_h(f)$ and $G(f)$ as the dB gain responses of the low-shelving filter, high-shelving filter, and complete gain-corrected dual-shelving filter. Also denote $K_l$ and $K_h$ as the individual dB gain parameters of the two shelving filters, and K the global dB gain correction applied to the dual-shelving filter. It is desirable to control the resulting response $G(f)$ at three independent frequencies: 0 Hz, $f_N$ (the Nyquist frequency), and an intermediate frequency $f_c$. The dB summation of the two shelving filters responses together with the global gain correction K, evaluated at these three frequencies, yields:

$$\begin{bmatrix} G(0) \\ G(f_C) \\ G(f_N) \end{bmatrix} = \begin{bmatrix} 1 & 1 & 0 \\ 1 & G_{lc} & G_{hc} \\ 1 & 0 & 1 \end{bmatrix} \begin{bmatrix} K \\ K_l \\ K_h \end{bmatrix} = \overline{G} \begin{bmatrix} K \\ K_l \\ K_h \end{bmatrix},$$

where $G_{lc}$ and $G_{hc}$ denote, respectively, the dB gain at frequency $f_c$ of the low-shelving and high-shelving filters when their gain setting is +1 dB.

A closed-form solution for the triplet of internal gain settings [K $K_l$ $K_h$] can now be obtained by matrix inversion:

$$\begin{bmatrix} K \\ K_l \\ K_h \end{bmatrix} = \overline{G}^{-1} \begin{bmatrix} G(0) \\ G(f_C) \\ G(f_N) \end{bmatrix}.$$

II.G. Multi-Band Equalizer

In various embodiments, multi-band equalizers can be obtained by cascading together multiple proportional filter sections. For example, multi-band equalizers can be obtained by cascading together multiple proportional peaking filter sections. As a result, the amplitude responses of the individual sections multiply together to form the composite response of the graphic equalizer. When viewed on a log (dB) scale, the N individual peaking filter responses $p_n(f)$ are summed together linearly to yield the composite magnitude response $G(f)$.

$$G(f) = \sum_{n=1}^{N} p(c_n, q_n, g_n, f), \quad (1)$$

where $p_n(f)$ is expanded to the generic proportional parametric equalizer section with design parameters of center frequency $c_n$, Q factor $q_n$, and gain $g_n$.

Figure 12:
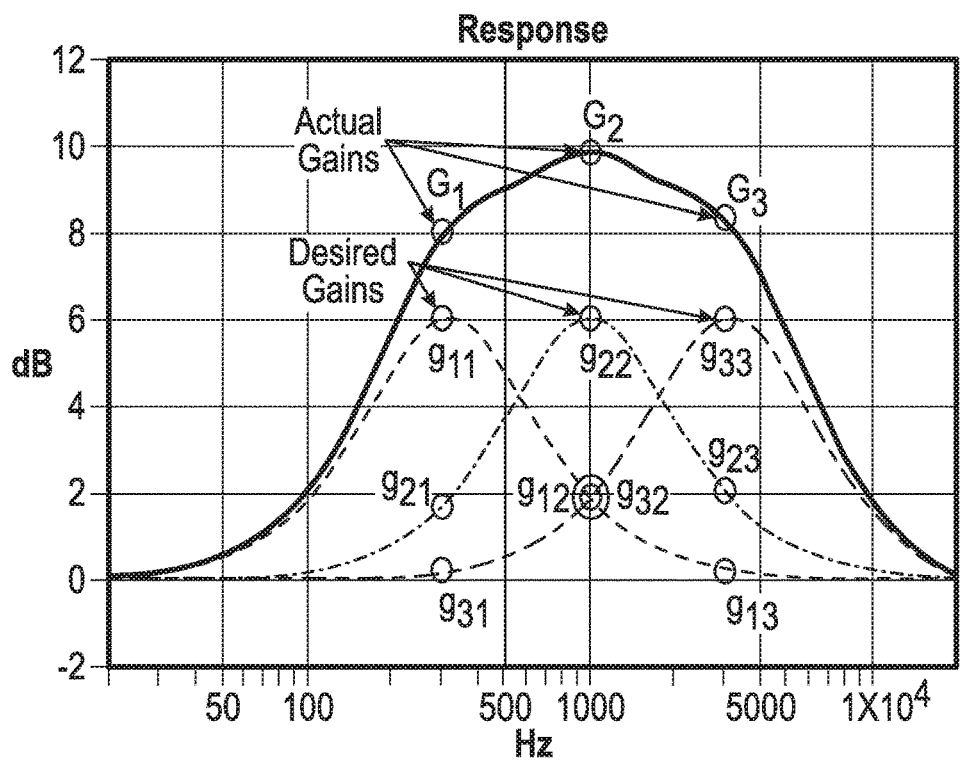
FIG. 12 illustrates a response before correction of a multi-band equalizer, in accordance with various embodiments.

Note that each g value is the designed gain for that section, so its response at $f=c_n$ will be exactly $g_n$, but the total response of the equalizer at $f=c_n$ will have the responses from all of the other sections at that frequency added in, so in general it will be different than $g_n$. This means that setting each of the N section gains directly to the N control gains specified by the operator will result in a total response different than the one specified, as illustrated in FIG. 12. Conversely, it means that if the total response is to match the operator specification, the individual section gains are altered, according to an embodiment, in such a way that the total response matches the specification at each of the N control frequencies.

Since the peaking filter sections exhibit the proportionality property, and since the total response is simply a sum of the section responses, the decibel response of the graphic equalizer at each center frequency $c_n$ is a linear combination of the individual gain values $g_n$ set for each of the sections. It follows that these are algebraically related to the graphic equalizer's gain control settings by a system of linear equations. In other words, equation (1) is repeated with f sequenced through each of the N control frequencies $c_n$.

Now the system can be solved, for example, by using a closed-form matrix inversion, to yield a new system of linear equations with the operator's gain settings as the input and the internal gain parameter for each of the component filter sections as the output. The result is an efficient graphic equalizer filter implementation, whose accuracy is limited only by the dB response linearity of the parametric equalizer used in each band.

To illustrate how this works in practice, the composite response of a graphic equalizer was computed when the gain of each parametric section was set as shown in FIG. 11. In particular, the three gains were set to $g_{11}$, $g_{22}$ and $g_{33}$. In this case the total response of the first graphic EQ band at $f=c_1$ is the sum of the three section responses a $f=c_1$:

$$G_1 = p_1(c_1) + p_2(c_1) + p_3(c_1) = g_{11} + g_{21} + g_{31},$$

where for brevity, the following are defined $G_n = G(c_n)$ and $g_{nm} = p_n(c_m)$, which itself is a shortened version of $p(c_n, q_n, c_m)$. Similar equations define the gain for the remaining two bands, so the total response in matrix form is:

$$\begin{bmatrix} G_1 & G_2 & G_3 \end{bmatrix} = \begin{bmatrix} 1 & 1 & 1 \end{bmatrix} \begin{bmatrix} g_{11} & g_{12} & g_{13} \\ g_{21} & g_{22} & g_{23} \\ g_{31} & g_{32} & g_{33} \end{bmatrix}.$$

This design provides direct control over the diagonal elements of the matrix only, but this does not translate to direct control over the total response, due to the interference of the off-diagonal elements. So the gains were modified to provide control in such a way that the resulting composite gains match the desired settings of the graphic equalizer as a whole.

This can be achieved by introducing a correction factor $k_n$ for each of the gains over which there is independent control. It should be noted that any changes to one of the gains on the diagonal will affect the other gains in the same row, because each row represents a single parametric EQ section with a single gain control. Further, due to the proportionality of each equalizer section, the correction factor is modeled as a constant having the same scaling effect across all frequencies. However, since the parametric equalizer sections are not perfectly proportional the equation is an approximation.

$$\begin{bmatrix} G_1 & G_2 & G_3 \end{bmatrix} \approx \begin{bmatrix} 1 & 1 & 1 \end{bmatrix} \begin{bmatrix} k_1 g_{11} & k_1 g_{12} & k_1 g_{13} \\ k_2 g_{21} & k_2 g_{22} & k_2 g_{23} \\ k_3 g_{31} & k_3 g_{32} & k_3 g_{33} \end{bmatrix} \quad (2)$$

which simplifies to:

$$\begin{bmatrix} G_1 & G_2 & G_3 \end{bmatrix} = \begin{bmatrix} k_1 & k_2 & k_3 \end{bmatrix} \begin{bmatrix} g_{11} & g_{12} & g_{13} \\ g_{21} & g_{22} & g_{23} \\ g_{31} & g_{32} & g_{33} \end{bmatrix}.$$

This matrix can be inverted and rearranged to solve for the correction values:

$$[k_1 \quad k_2 \quad k_3] \approx [G_1 \quad G_2 \quad G_3] \begin{bmatrix} g_{11} & g_{12} & g_{13} \\ g_{21} & g_{22} & g_{23} \\ g_{31} & g_{32} & g_{33} \end{bmatrix}^{-1}.$$

Figure 13:
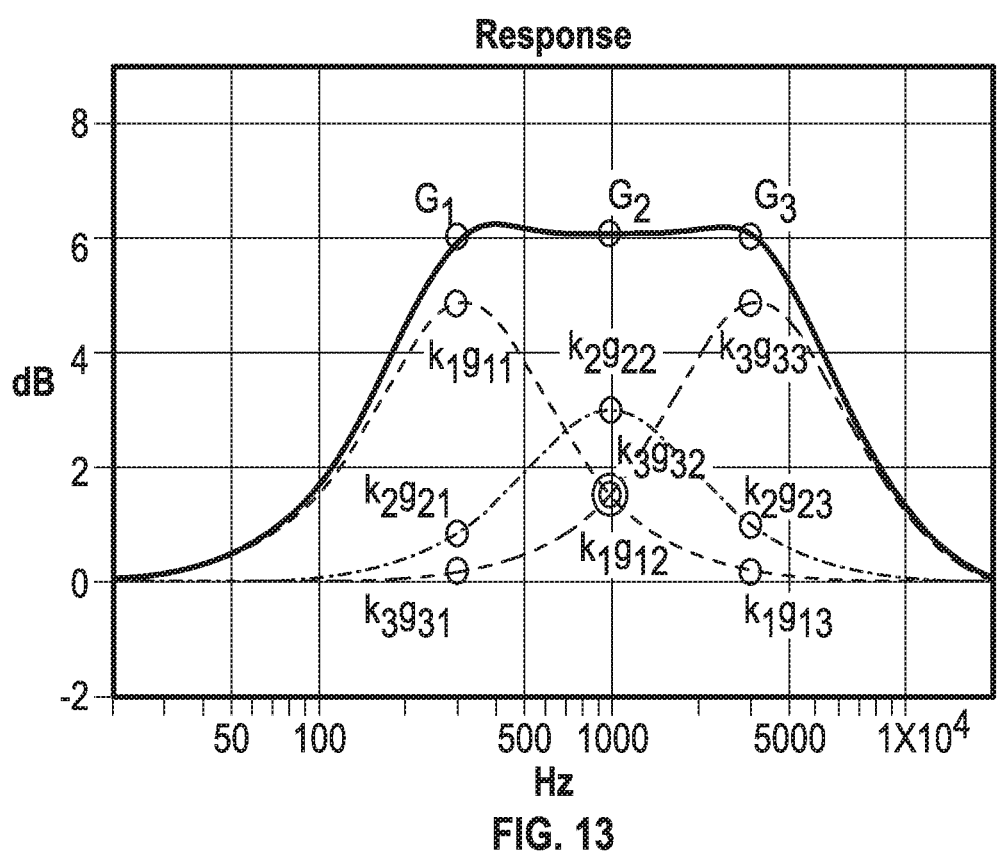
FIG. 13 illustrates a response after correction of the multi-band equalizer associated with FIG. 12, in accordance with various embodiments.

The $G_n$ values are the final graphic equalizer gains at the control frequencies. The desired control values can be substituted there and multiplied by the inverted matrix to determine the correction factors $k_n$ applied in Equation (2) to actually achieve the desired gains. Redesigning the internal parametric sections with the corrected gains yields a composite response very close to the desired response, as illustrated in FIG. 13.

This is a good result, but it relies on arbitrary settings for the $g_{11}$, $g_{22}$ and $g_{33}$ gain values in the original matrix, which end up getting cancelled in the final result due to the matrix inversion. If those gains can truly be given any arbitrary setting, it is possible to specify a matrix that is singular (for example, if any of the gains is set to 0 dB) and therefore cannot be inverted. But beyond that the gains do have a small effect on the measured, off-axis matrix elements due to the parametric filters not being perfectly proportional. For these reasons, it is desirable to have a safe and consistent way to choose the gain settings for the filter measurement step used to populate the gain matrix.

This can be achieved by introducing a prototype gain P into the design, which is a constant to be used for every $g_{nn}$ gain value when calculating the response matrix:

$$\begin{bmatrix} g_{11}=P & g_{12} & g_{13} \\ g_{21} & g_{22}=P & g_{23} \\ g_{31} & g_{32} & g_{33}=P \end{bmatrix}.$$

The actual value for P could be one (meaning 1 dB) or convenience, but due to the small non-uniformity of the filters and possible resolution issues, typically it can be chosen to be half the maximum allowed operator gain value. For the example embodiments presented here, $$P_{dB}=10.$$

Using a constant for the independent gains guarantees the matrix will not be singular for $P \neq 0$, so it can always be inverted. It also provides two additional benefits that reduce runtime complexity. First, since the matrix gains do not change based on operator settings, and since the other filter parameters are fixed for a graphic equalizer, the matrix elements can be calculated once at design time, and do not need to be recalculated when the operator adjusts the gain controls. Also, since the correction matrix is a constant, it can also be inverted once at design time instead of needing to be inverted at runtime. These benefits apply to graphic equalizers, but would not apply in general to multiband parametric equalizers, because modification of the $c_n$ or $q_n$ design parameters from Equation (1) would change the off-diagonal values in the matrix.

So the full equation to calculate the corrected design gains for a three-band equalizer, for example, becomes:

$$[k_1 \quad k_2 \quad k_3] \approx \quad (3)$$

$$[G_1 \quad G_2 \quad G_3] \begin{bmatrix} g_{11}=P & g_{12} & g_{13} \\ g_{21} & g_{22}=P & g_{23} \\ g_{31} & g_{32} & g_{33}=P \end{bmatrix}^{-1}.$$

Since the $k_n$ values are correction factors, the gain value passed into the proportional parametric equalizer is multiplied by $g_{nn}$, since that is the value to be "corrected." Since $g_{nn}$ is always set to P, the actual value used for gain in the parametric filter design will be $k_n P$. (To the reader, it may seem that this last term should instead be $k_n/P$; since all of the input values were effectively multiplied by P, it would make sense to then multiply the output values by the reciprocal 1/P. However, when the original matrix is scaled by a constant, then the resulting inverse matrix is scaled by the reciprocal of that constant, so the proper correction factor is $k_n P$.)

Alternative embodiments of multiband equalizers, used in systems and methods herein, can include, optionally, 1st-order or 2nd-order low and/or high proportional shelving filters. Adding shelving sections increases the complexity of the graphic equalizer and increases the resources needed to compute it. Even though the extra sections do not increase the number of operator controls, they still need to have their gains set internally within the graphic EQ, and their gain measurements must be included in the matrix calculations. For example, the three-band equalizer represented by the 3×3 matrix in equation (3) would instead be represented by a 5×5 matrix after low and high shelving sections are added, and the vectors would increase in size to five entries each.

II.G. Median Gain Offset

Figure 14:
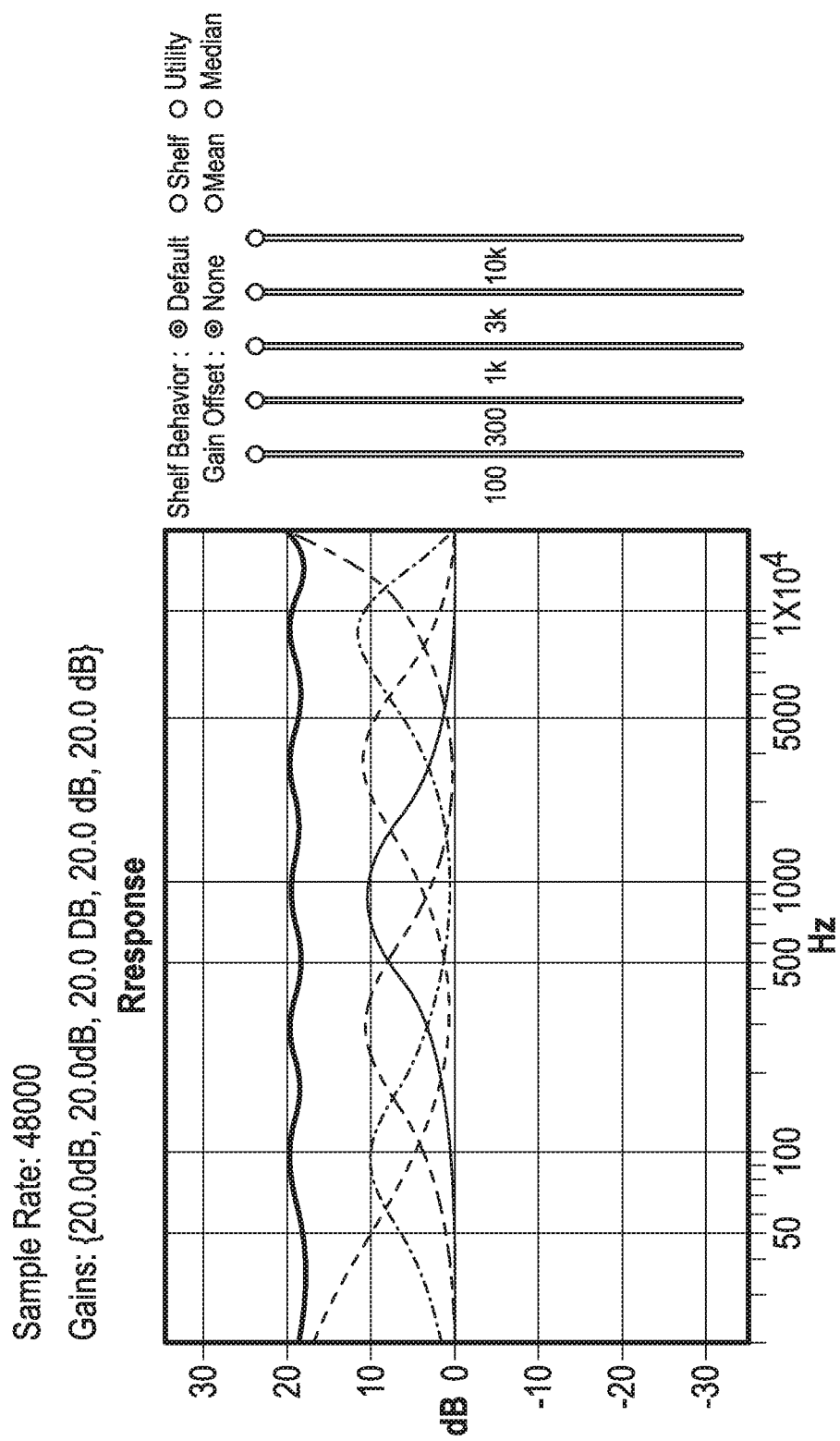
FIG. 14 illustrates a noticeable ripple between band center frequencies that occurs when several adjacent bands are set to the same gain, in accordance with various embodiments.
Figure 15:
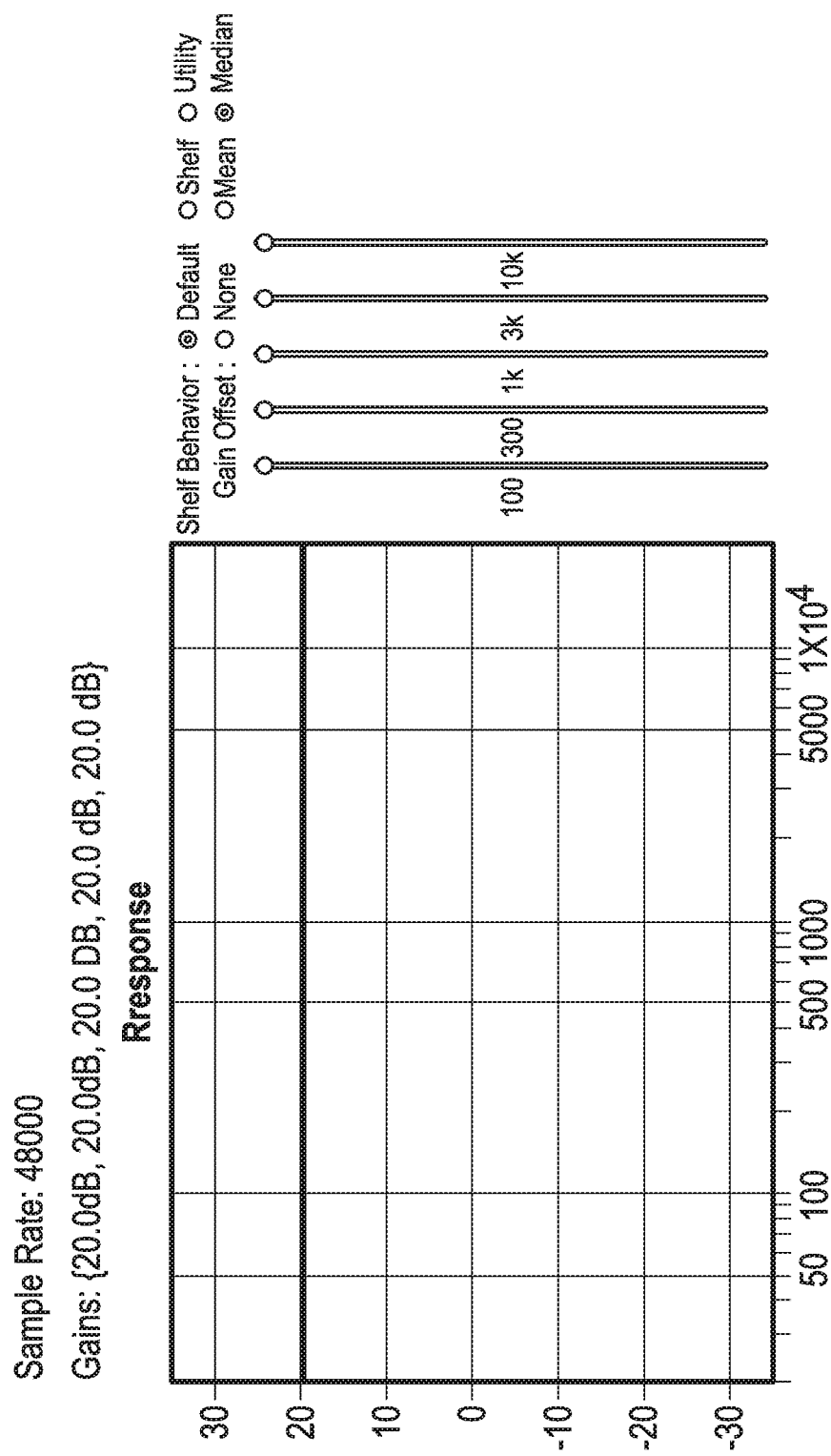
FIG. 15 illustrates how the ripple effect shown in FIG. 14 can be mitigated using a median gain offset to make the response flat, in accordance with various embodiments.

In various embodiments, an example equalizer can include other modifications to improve both the accuracy and the smoothness of the graphic EQ response. For some settings, especially when several adjacent bands are set to the same target gain parameter value, the response can have a noticeable ripple due to dips between the control frequencies, as illustrated in FIG. 14. In order to mitigate this problem, the median gain from among the target gain parameter values can be applied as an offset to the entire signal, while also subtracting out the same offset from each of the operator gain controls. For example, even if all target gain parameter values are set to maximum, the response will not have any ripple because the processing is handled by a single constant gain, as illustrated in FIG. 15.

II.H. Examples of Multi-Band Equalizer Responses

Figure 1:
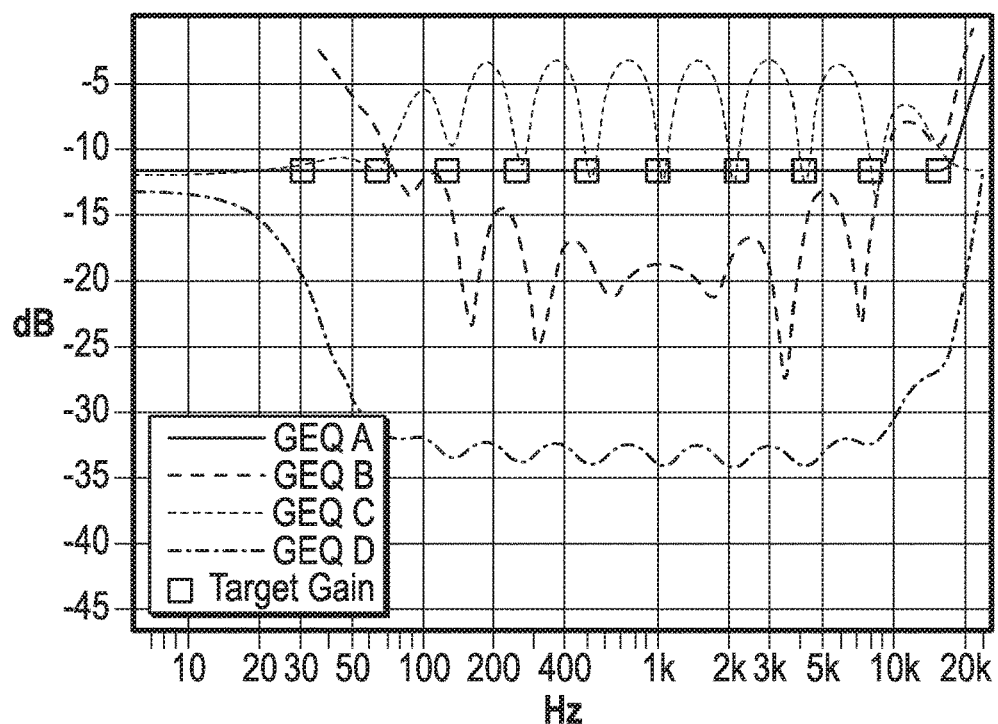
FIG. 1 illustrates responses of several different graphic equalizer implementations currently available when all gains are set to −12 dB.

In order to illustrate embodiments of an audio spectral correction system and method as taught herein, two graphic equalizers (5-band and 10-band) were implemented and some of their responses are shown in the Figures. Referring again to FIGS. 1-3, other IIR and even some FIR-based equalizers often had responses that missed the specified control values by 5 dB, 10 dB or more. With the same or similar settings, embodiments of systems and methods, as taught herein, can achieve accuracy to within 1 dB in most cases. With large or extreme settings, some bands may miss the mark by 2 dB, which is due to less-than-perfectly proportional filter sections, and the resulting nonlinear effect is greater at high gain settings.

Figure 2:
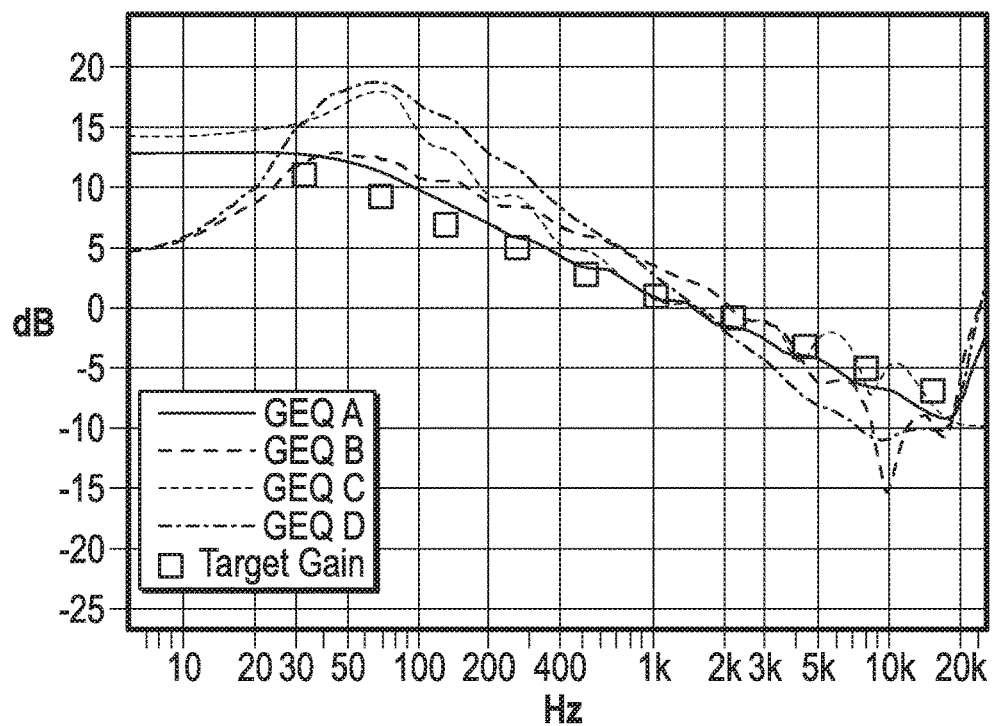
FIG. 2 illustrates responses of several different graphic equalizer implementations currently available with the gains ramped down.
Figure 3:
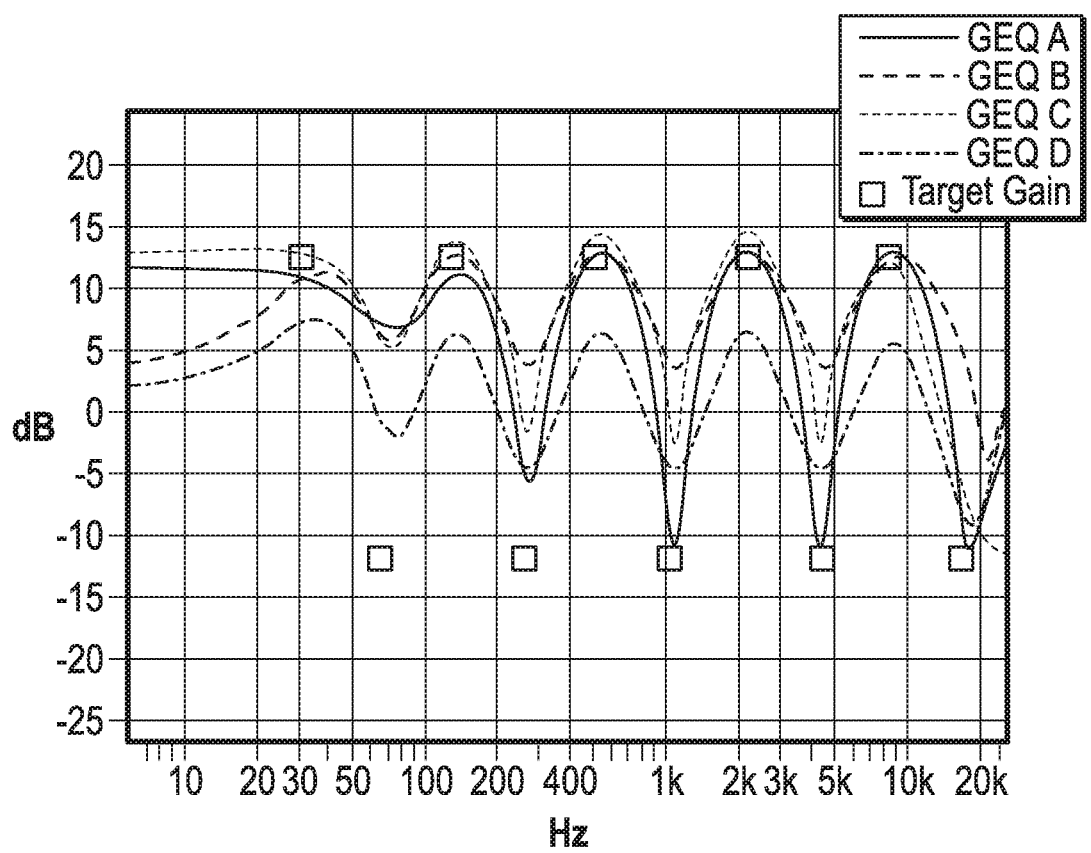
FIG. 3 illustrates responses of several different graphic equalizer implementations currently available with alternating high/low gains.
Figure 16:
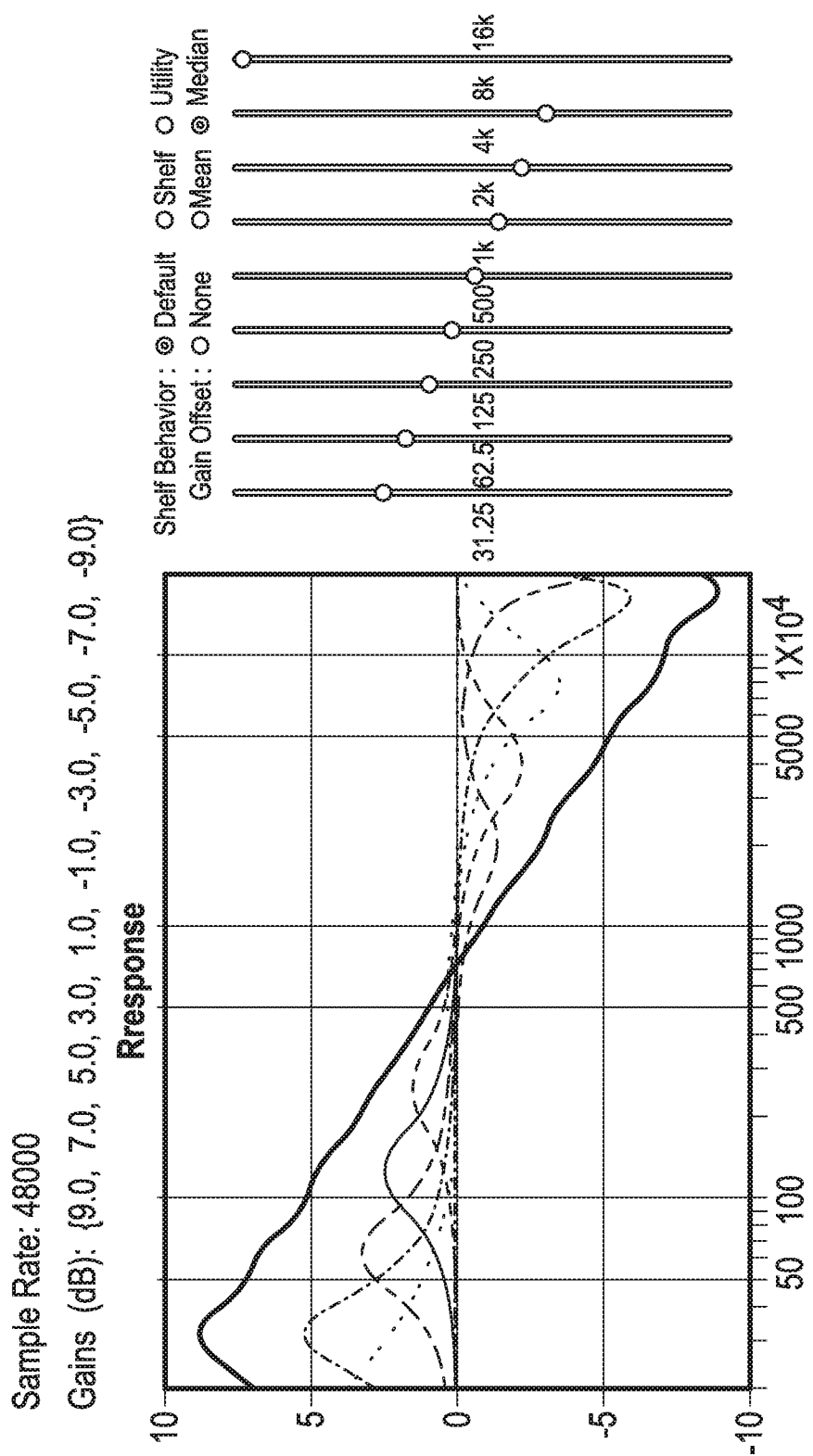
FIG. 16 illustrates an example ten-band graphic equalizer having the same settings as shown in FIG. 2, in accordance with various embodiments.
Figure 17:
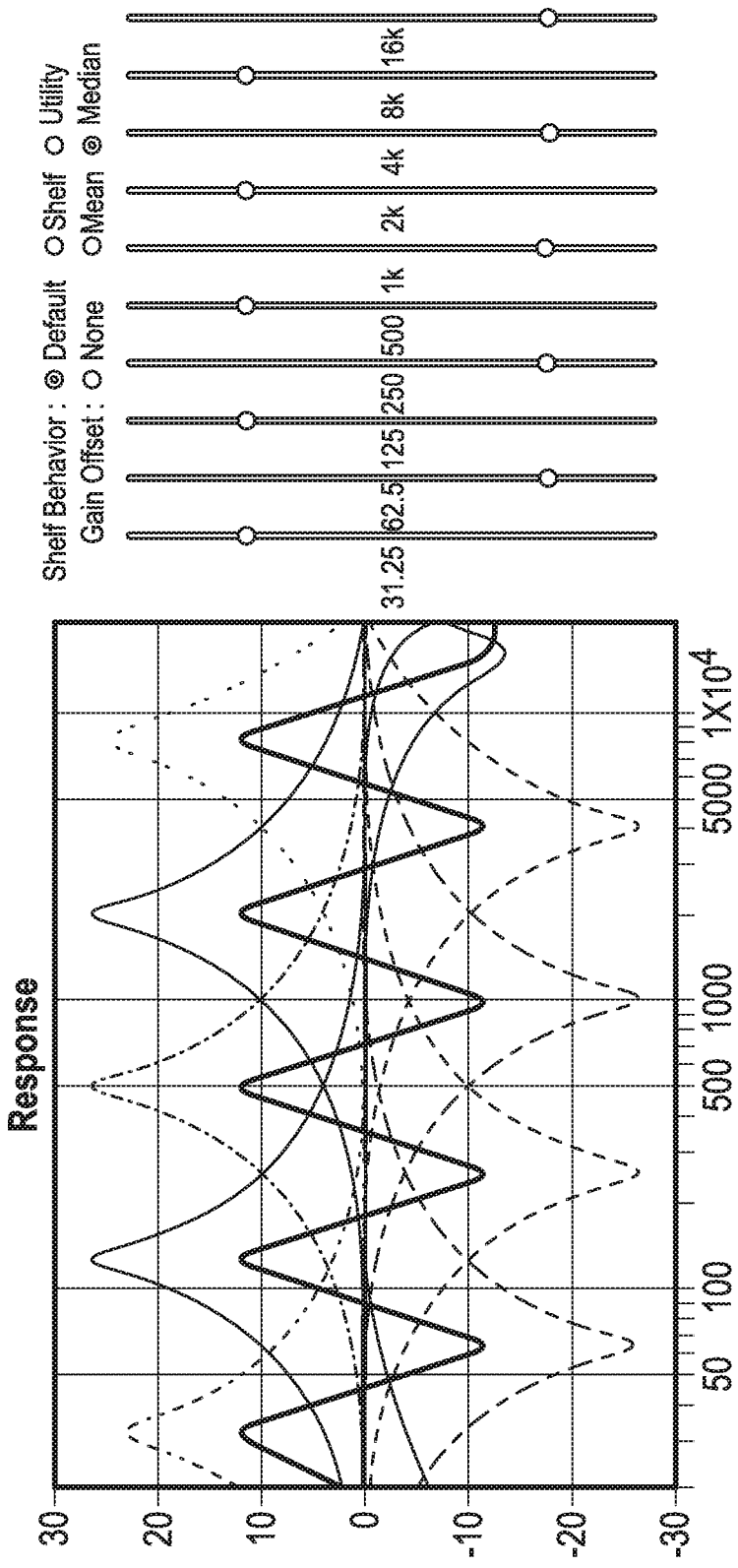
FIG. 17 illustrates an example ten-band graphic equalizer having the same settings as shown in FIG. 3, in accordance with various embodiments.
Figure 18:
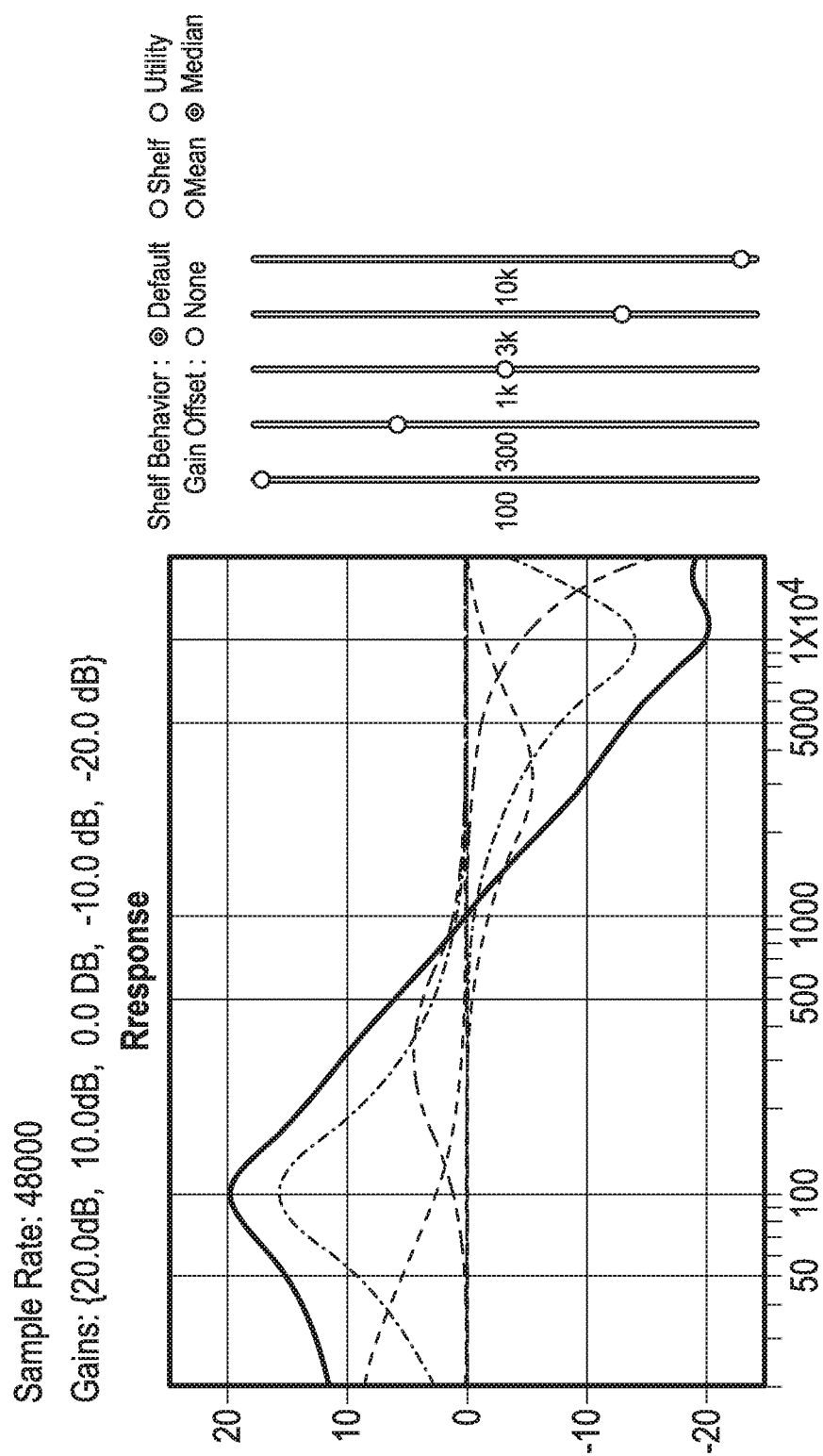
FIG. 18 illustrates an example five-band graphic equalizer having settings similar to those shown in FIG. 2, in accordance with various embodiments.
Figure 19:
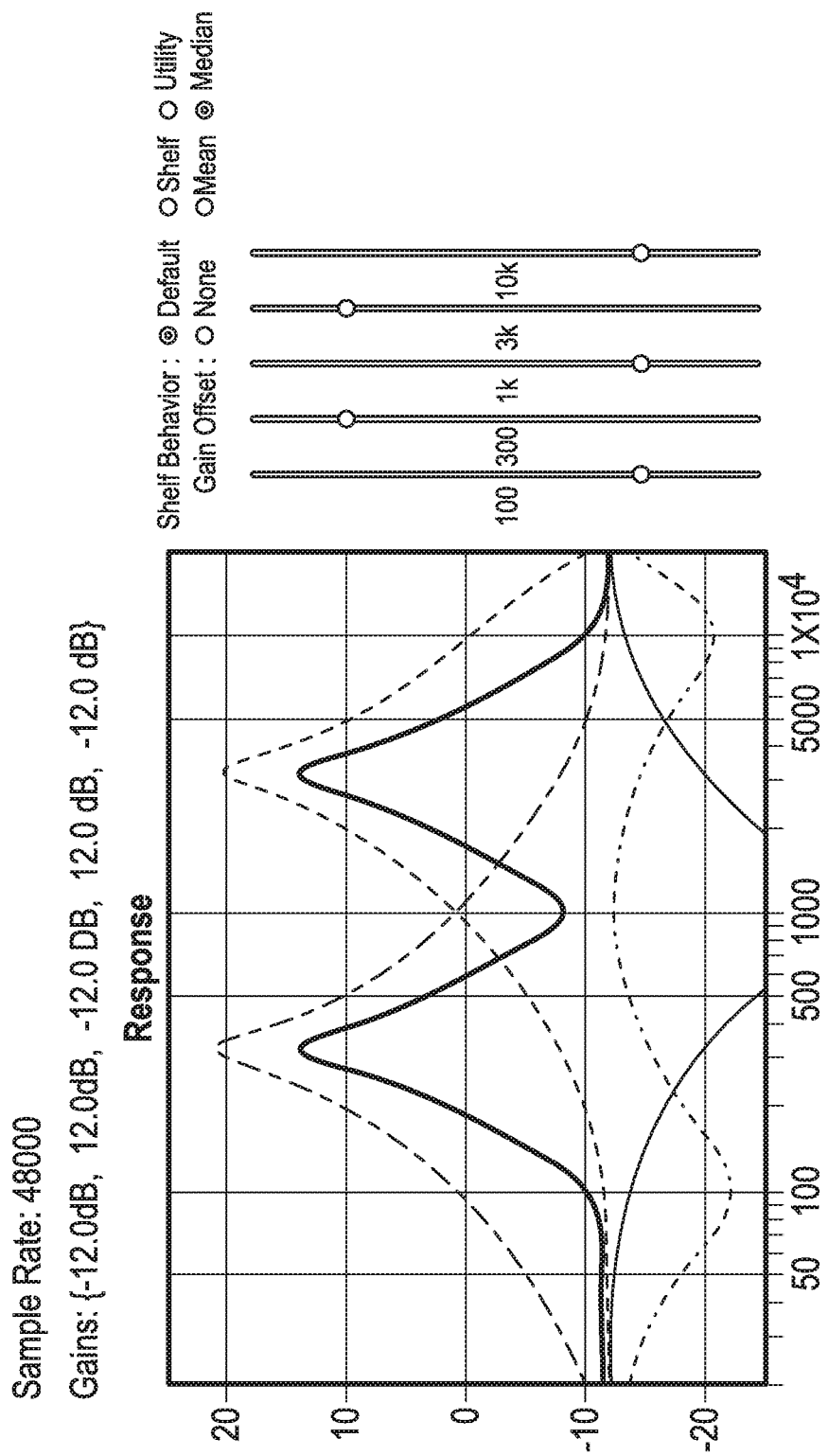
FIG. 19 illustrates an example five-band graphic equalizer having settings similar to those shown in FIG. 3, in accordance with various embodiments.

Example results are shown in FIGS. 16-19. Specifically, FIG. 16 illustrates a ten-band graphic equalizer of an example embodiment of a system having the same settings as shown in FIG. 2. FIG. 17 illustrates the ten-band graphic equalizer of an example embodiment of a system having the same settings as shown in FIG. 3. FIG. 18 illustrates a five-band graphic equalizer of an example embodiment of a system having the same settings as shown in FIG. 2. FIG. 19 illustrates the five-band graphic equalizer of an example embodiment of a system having the same settings as shown in FIG. 3.

Figure 20:
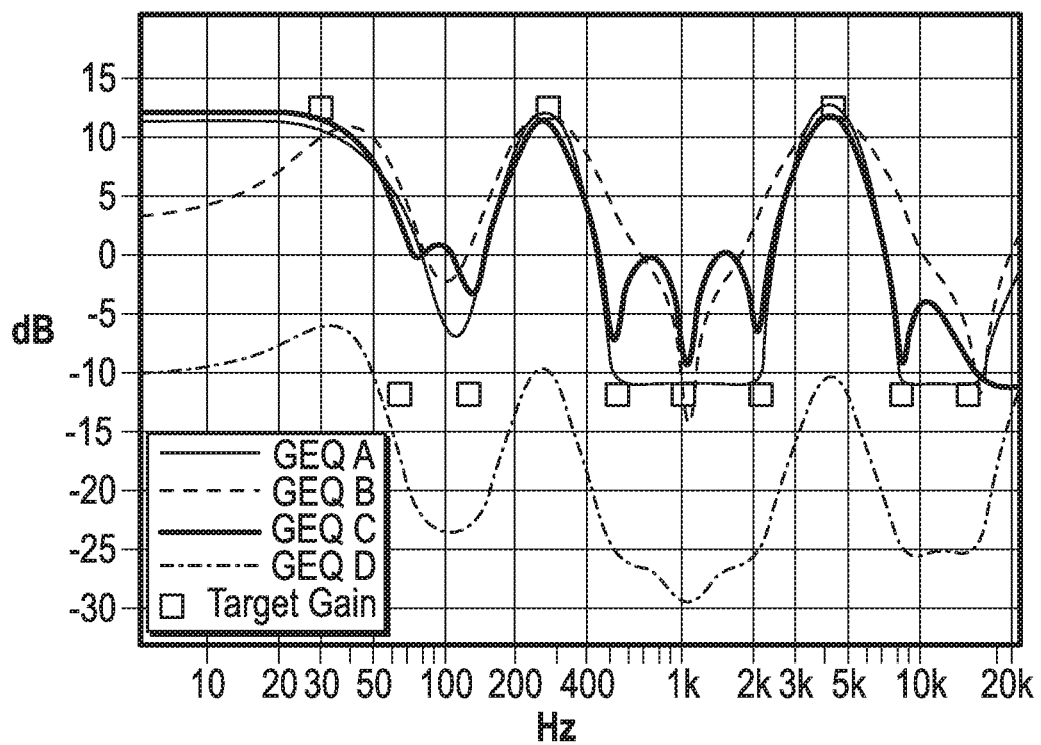
FIG. 20 illustrates responses of several different ten-band graphic equalizer implementations currently available with an example gain setting configuration.
Figure 21:
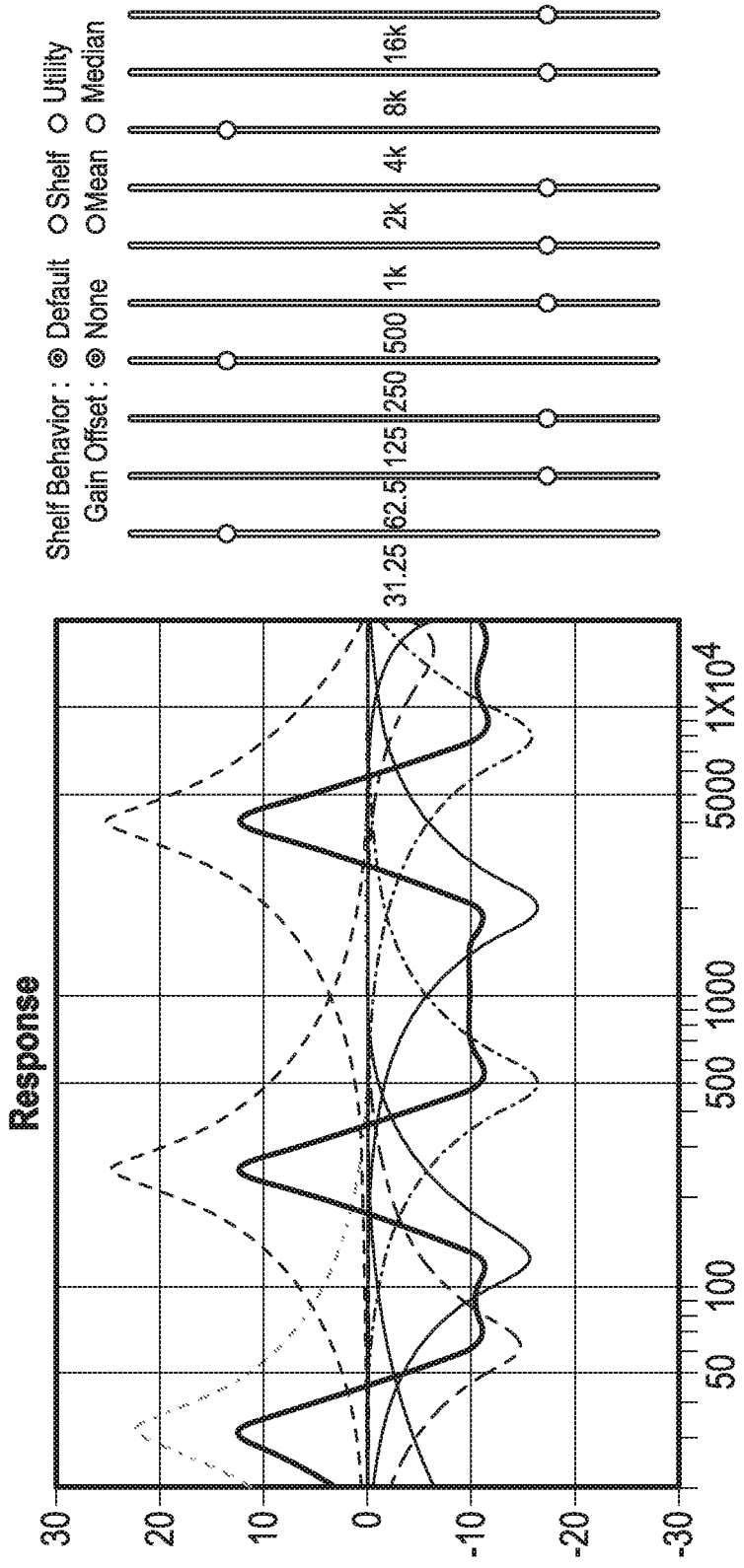
FIG. 21 illustrates an example ten-band graphic equalizer having the same settings as shown in FIG. 20, in accordance with various embodiments.

For comparison with the ten-band commercial equalizers, some of which have a maximum range of ±12 dB, the worst-case error for a single band of embodiments was found by exhaustively searching all possible settings with each band at either +12 or −12 dB and measuring the error at each band for each of those settings. FIG. 20 illustrates the response for commercial ten-band graphic equalizers GEQ A, GEQ B, GEQ C, and GEQ D when set to the same settings as the worst-case for an embodiment. For comparison, FIG. 21 illustrates the worst-case error for an embodiment of a ten-band graphic equalizer as taught herein. The worst-case error for any band in FIG. 21 was found to be 2.28 dB for the 1 kHz band in the same configuration as the existing ten-band graphic equalizers. Comparison was made with each of the commercial graphic equalizers in that same configuration, with results shown in FIGS. 20 and 21 in the table below. Note that this configuration is not necessarily the worst case for any of the existing equalizers.

| Equalizer | Worst-Case Band | Error |
|---|---|---|
| GEQ A | 62 Hz | 13 dB |
| GEQ B | 500 Hz | 15 dB |
| GEQ C | 62 Hz | 6 dB |
| GEQ D | 4 kHz | 23 dB |
| New Design | 1 kHz | 2.28 B |

Despite the imperfect proportionality, embodiments of systems and methods as taught herein perform well compared to other designs, even under worst-case operator settings.

II.I. Artificial Reverberation and Sound Absorption

Figure 22:
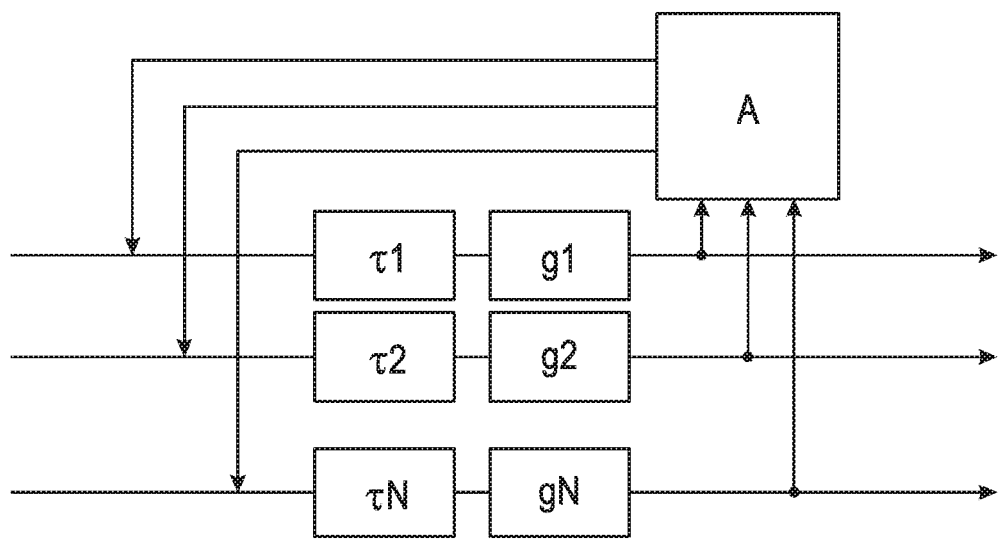
FIG. 22 is a block diagram illustrating a canonic feedback delay network reverberator structure, in accordance with various embodiments.

A common approach for designing computationally efficient digital reverberators is based on forming a multi-channel recursive network of delay units, or Feedback Delay Network (FDN), and inserting adequately tuned absorptive filters at selected nodes in the network. An example FDN topology having delay units with delay lengths of $\tau_1, \tau_2 \ldots \tau_N$, each cascaded with corresponding filters $g_1, g_2 \ldots g_N$, with a feedback matrix A is illustrated in FIG. 22. A general reverberator design method involves (a) building a "lossless prototype" network having an energy-preserving (i.e. all-pass) feedback loop, and (b) providing frequency-dependent control of the reverberation energy decay rate by cascading with each delay unit in the network's feedback loop an absorptive filter whose (negative) dB gain $G_i(f)$ at any frequency f is proportional to the unit delay length $\tau_i$ divided by the reverberation decay time Tr(f):

$$G_i(f) = 20\log_{10}|g_i(f)| = -60\frac{\tau_i}{Tr(f)}.$$

Consequently, implementing parametric control of the reverberator's decay time requires that the set of absorptive filters $\{g_i\}$ form a family of mutually proportional parametric equalizers, and that their dB gain vary proportionally in response to scaling of the decay time Tr(f).

Embodiments of proportional parametric equalizers in accordance with embodiments of systems and methods as taught herein enable the realization of flexible absorptive filters supporting reverberation decay time control in two, three, or more frequency bands, with adjustable cross-over or control frequencies. For instance, each absorptive filter may be realized as a multi-band equalizer, where the dB gain setting at each of the control frequencies $\{c_n\}$ is proportional to the corresponding delay length and inversely proportional to the reverberation decay time at setting at frequency $c_n$.

Similarly, sound absorption by a propagation medium lends itself naturally to simulation by parametric proportional equalizers. Indeed, the increase of attenuation with source-to-listener distance is fundamentally similar in nature to the delay-dependent absorption provided by the absorptive filters in an artificial reverberator, as described above. In both cases, the attenuation adds up, linearly in decibels, proportionally to propagation time or distance.

II.J. Composite Spectral Correction Effects

Figure 23:
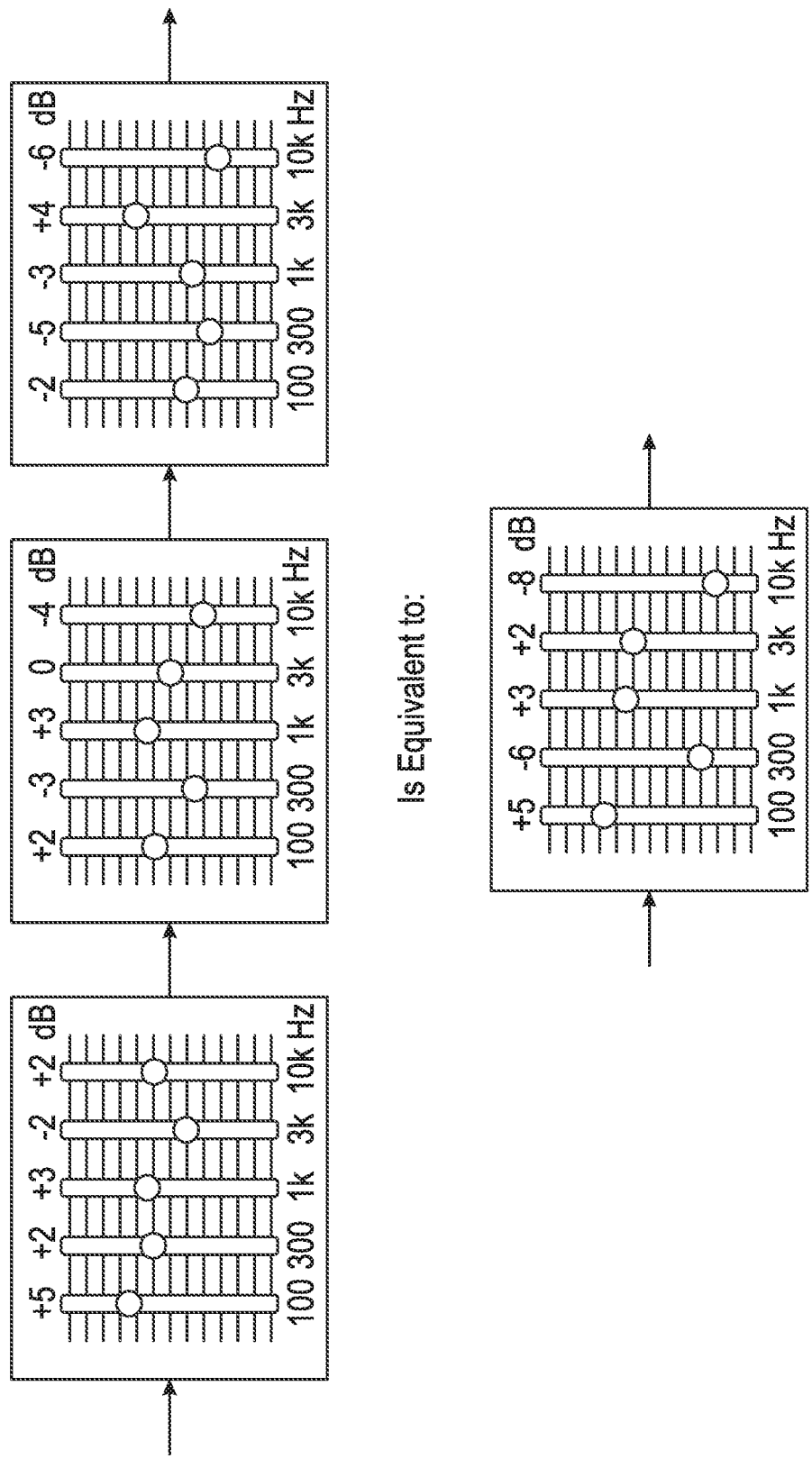
FIG. 23 illustrates composite spectral effects whereby a combination of three cascaded spectral correction functions are implemented using an example audio spectral correction system and method for a single multi-band equalizer, in accordance with various embodiments.

Because of their accurate gain control property, embodiments as taught herein enable efficient realization of a cascade combination of several spectral correctors, by lumping all of them into a single multi-band equalizer. As illustrated in FIG. 23, this can be achieved by modeling all spectral correctors as multi-band equalizers having a common set of control frequencies, simulating their combination by adding dB gains for each control frequency, and applying the resulting composite gains in a single multi-band equalizer. In other words, FIG. 23 illustrates composite spectral effects whereby a combination of three cascaded spectral correction functions is implemented using embodiments of an audio spectral correction system and method, as taught herein, into a single multi-band equalizer.

II.K. Processing and Systems

Figure 24:
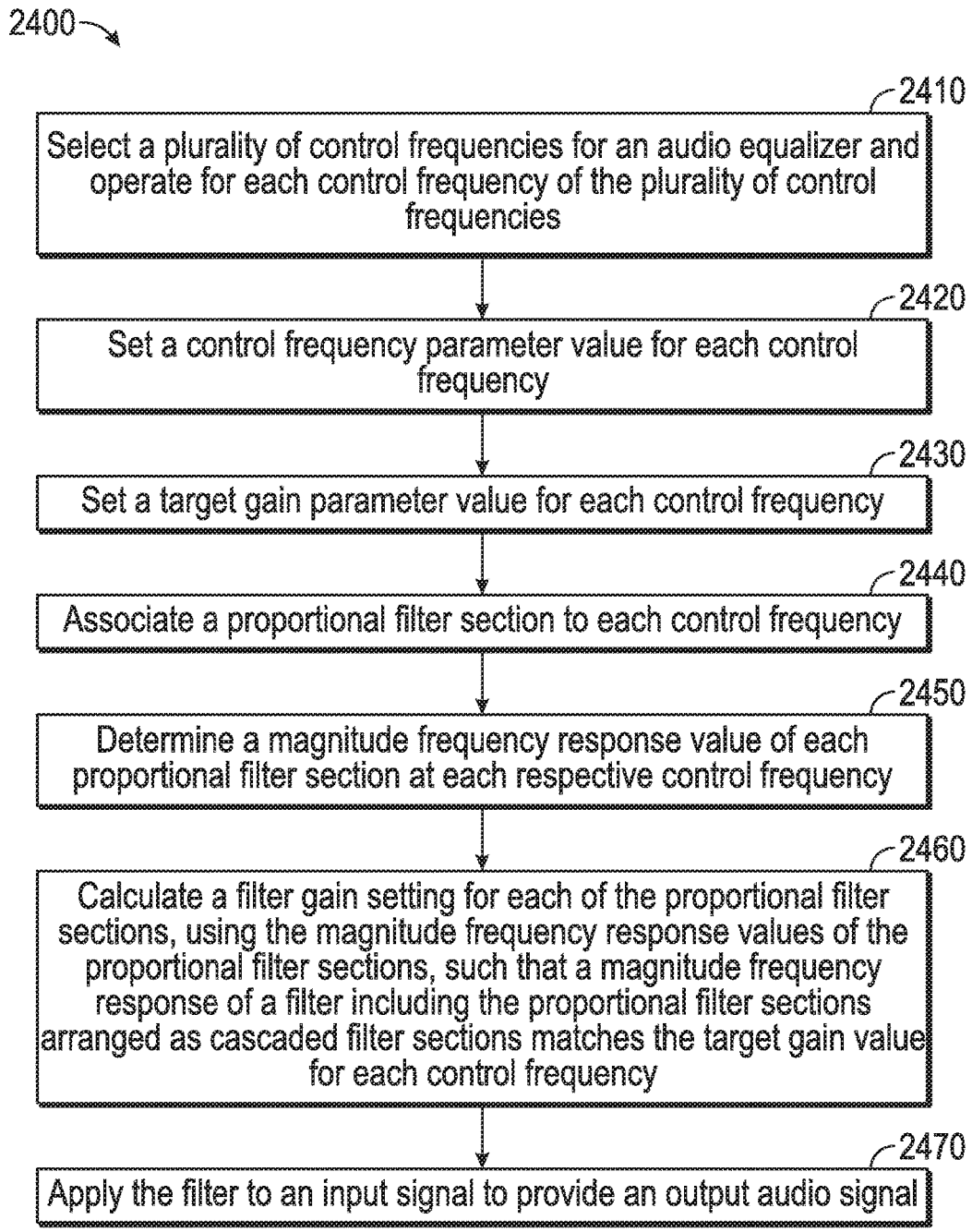
FIG. 24 is a flow diagram of features of an example method of processing signals input to an audio equalizer, in accordance with various embodiments.

FIG. 24 is a flow diagram of features of an embodiment of an example method 2400 of processing signals input to an audio equalizer. At 2410, a plurality of control frequencies is selected for an audio equalizer and operations for each control frequency of the plurality of control frequencies is conducted. At 2420, a control frequency parameter value is set for each control frequency. At 2430, a target gain parameter value is set for each control frequency. At 2440, a proportional filter section is associated to each control frequency. At 2450, a magnitude frequency response value of each proportional filter section at each respective control frequency is determined for a reference value of the filter section's gain setting.

At 2460, a filter gain setting for each of the proportional filter sections is calculated, using the magnitude frequency response values of the proportional filter sections, such that a magnitude frequency response of a filter including the proportional filter sections arranged as cascaded filter sections substantially matches the target gain value for each control frequency. Matching the target gain value for each control frequency can include matching the target gain value for each control frequency by multiplying a vector of the target gain parameter values with a matrix derived from the magnitude frequency response values of the proportional filter sections at each control frequency, obtained for a reference value of the filter gain setting of each proportional filter section.

At 2470, the filter is applied to an input signal to provide an output audio signal. The filter including the proportional filter sections can be formed and arranged as cascaded filter sections to include a low shelving filter and a high shelving filter cascaded with peaking filter sections.

Variations of method 2400 or methods similar to method 2400 can include a number of different embodiments that may or may not be combined depending on the application of such methods and/or the architecture of systems in which such methods are implemented. Such methods can include the proportional filter sections to include peaking filter sections and/or shelving filter sections. A quality factor can be set for each of the peaking filter sections. Setting the quality factor for the peaking filter sections can include iteratively tuning the quality factors. Iteratively tuning the quality factors can include setting two adjacent control values to a same gain setting and all others to zero; and adjusting a shared Q factor for the two adjacent control values such that response between the two frequencies is as flat as possible. In a non-limiting example, setting the quality factor can include setting the quality factor to 0.52 for a 5-band equalizer and to 0.98 for a 10-band equalizer.

Variations of method 2400 or methods similar to method 2400 can include selecting a plurality of delay units for a digital reverberator having a reverberation decay time, each delay unit having a delay length; forming a set of multi-band equalizers for the digital reverberator, each multi-band equalizer corresponding to a delay unit and having a target gain parameter value at each control frequency proportional to a corresponding delay length and inversely proportional to the reverberation decay time at the respective control frequency; and cascading each delay unit of the plurality of delay units with the corresponding multi-band equalizer of the set of multi-band equalizers. Generating the set of multi-band equalizers can include varying the target gain parameter values of the set of multi-band equalizers proportionally in response to scaling of the reverberation decay time.

Variations of method 2400 or methods similar to method 2400 can include modifying the filter including the proportional filter sections and the application of the filter by computing a median gain offset, expressed in dB, and subtracting the median gain offset from each target gain parameter value; calculating the filter gain setting for each of the proportional filter sections with respect to the target gain parameter value less the median gain offset for each control frequency; and applying the filter and the median gain offset to the input signal to provide the output audio signal.

Variations of method 2400 or methods similar to method 2400 can include modeling a plurality of multi-band equalizers having a common set of control frequencies; simulating combination of the multi-band equalizers of the plurality of multi-band equalizers by adding their target gain parameter values for each control frequency; applying the resulting composite gains in generating a single multi-band equalizer that replaces a cascade of the plurality of multi-band equalizers, wherein generating the single multi-band equalizer includes generating the filter including the proportional filter sections arranged as cascaded filter sections from selecting the common set of control frequencies as the plurality of control frequencies; and applying the filter of the single multi-band equalizer to the input signal to provide the output audio signal. The filter including the proportional filter sections can be formed and arranged as cascaded filter sections to include a low shelving filter and a high shelving filter cascaded with the proportional filter sections. The filter of the single multi-band equalizer including the proportional filter sections arranged as cascaded filter sections can include the filter modified by computing a median gain offset and subtracting the median gain offset from each target gain parameter value for each control frequency in generating the proportional filter sections; and applying the modified filter of the single multi-band equalizer to the input signal can include applying the median gain offset to the input signal to provide the output audio signal.

In various embodiments, a non-transitory machine-readable storage device can comprise instructions stored thereon, which, when performed by a machine, cause the machine to perform operations, the operations comprising one or more features similar to or identical to features of methods and techniques described with respect to method 2400, variations thereof, and/or features of other methods taught herein. The physical structures of such instructions may be operated on by one or more processors. Executing these physical structures can cause the machine to perform operations comprising: selecting a plurality of control frequencies for an audio equalizer; for each control frequency of the plurality of control frequencies, setting a control frequency parameter value; setting a target gain parameter value; associating a proportional filter section; and determining a magnitude frequency response value of each proportional filter section; calculating a filter gain setting for each of the proportional filter sections, using the magnitude frequency response values of the proportional filter sections, such that a magnitude frequency response of a filter including the proportional filter sections arranged as cascaded filter sections substantially matches the target gain value for each control frequency; and applying the filter to an input signal to provide an output audio signal.

In variations of the machine-readable storage devices, instructions can include instructions to perform operations that can include the proportional filter sections to include peaking filter sections and the operations to include setting a quality factor for each of the peaking filter sections; and iteratively tuning the quality factors by setting two adjacent control values to a same gain setting and all others to zero, and adjusting a shared Q factor for the two adjacent control values such that response between the two frequencies is as flat as possible.

In variations of the machine-readable storage devices, instructions can include instructions to perform operations that can include matching the target gain value for each control frequency by multiplying a vector of the target gain parameter values with a matrix derived from the magnitude frequency response values of the proportional filter sections at each control frequency, obtained for a reference value of the filter gain setting of each proportional filter section.

In variations of the machine-readable storage devices, instructions can include instructions to perform operations that can include forming the filter including the proportional filter sections arranged as cascaded filter sections to include a low shelving filter and a high shelving filter cascaded with peaking filter sections.

In variations of the machine-readable storage devices, instructions can include instructions to perform operations that can include: selecting a plurality of delay units for a digital reverberator having a reverberation decay time, each delay unit having a delay length; forming a set of multi-band equalizers for the digital reverberator, each multi-band equalizer corresponding to a delay unit and having a target gain parameter value at each control frequency proportional to a corresponding delay length and inversely proportional to the reverberation decay time at the respective control frequency; and cascading each delay unit of the plurality of delay units with the corresponding multi-band equalizer of the set of multi-band equalizers.

In variations of the machine-readable storage devices, instructions can include instructions to perform operations that can include: modifying the filter including the proportional filter sections and the application of the filter by computing a median gain offset, expressed in dB, and subtracting the median gain offset from each target gain parameter value; calculating the filter gain setting for each of the proportional filter sections with respect to the target gain parameter value less the median gain offset for each control frequency; and applying the filter and the median gain offset to the input signal to provide the output audio signal.

In variations of the machine-readable storage devices, instructions can include instructions to perform operations that can include: modeling a plurality of multi-band equalizers having a common set of control frequencies; simulating combination of the multi-band equalizers of the plurality of multi-band equalizers by adding their tan-let gain parameter values for each control frequency; applying the resulting composite gains in generating a single multi-band equalizer that replaces a cascade of the plurality of multi-band equalizers, wherein generating the single multi-band equalizer includes generating the filter including the proportional filter sections arranged as cascaded filter sections from selecting the common set of control frequencies as the plurality of control frequencies; and applying the filter of the single multi-band equalizer to the input signal to provide the output audio signal.

Figure 25:
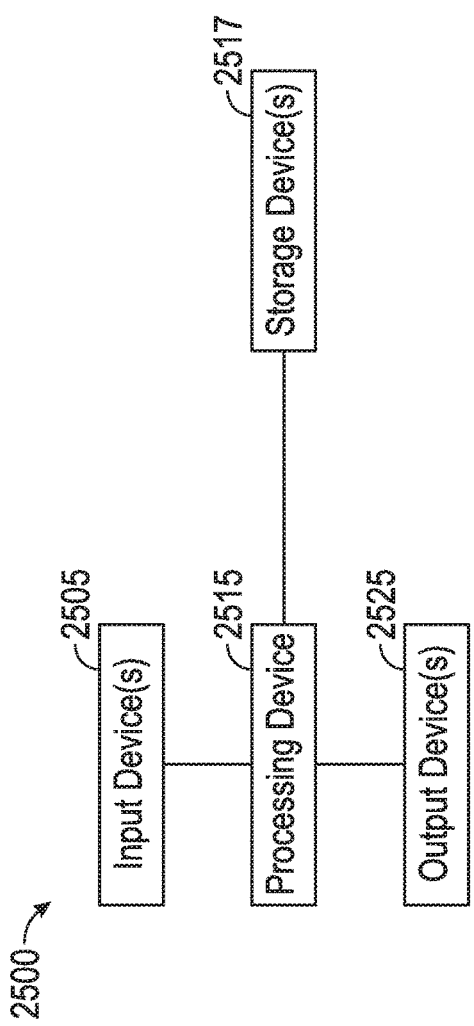
FIG. 25 is a block diagram of an example audio system arranged to operate with respect to audio equalization, in accordance with various embodiments.

FIG. 25 is a block diagram of an embodiment of an example audio system 2500 arranged to operate with respect to audio equalization according to techniques as taught herein. Audio system 2500 can include an input device 2505 and a processing device 2515 operatively coupled to the input device 2505 to receive an input signal and to operate on the input signal to control generation of an output audio signal from the input signal. Input device 2505 can include one or more sources of audio such as DVD player, blueray device, TV tuner, CD player, handheld player, internet audio/video, gaming console, or other device providing a signal for audio production. Input device 2505 may be a node or a set of nodes that provide a source of input for one or more signals to processing device 2515. The output audio signal may be transmitted to an audio output device 2525 such as speakers. The speakers may be stereo speakers, surround sound speakers, headset speakers, or other similar audio output device.

Processing device 2515 can be realized by a variety of instrumentalities to execute and/or control functions associated with operating on signals for audio production as taught herein. Such instrumentalities can include one or more devices such as, but not limited to, a general purpose processor, a computing device having one or more processing devices, a digital signal processor (DSP), an application specific integrated circuit (ASIC), a field programmable gate array (FPGA) or other programmable logic device, discrete gate or transistor logic, discrete hardware components, or any combination thereof. Processing device 2515 may be operatively coupled to one or more storage devices 2517 that store instructions and data for processing as taught herein. Storage devices 2517 can be realized by a number of machine-readable storage devices.

Processing device 2515 can be arranged to select a plurality of control frequencies for an audio equalizer; for each control frequency of the plurality of control frequencies, set a control frequency parameter value; set a target gain parameter value; associate a proportional filter section; and determine a magnitude frequency response value of each proportional filter section; calculate a filter gain setting for each of the proportional filter sections, using the magnitude frequency response values of the proportional filter sections, such that a magnitude frequency response of a filter including the proportional filter sections arranged as cascaded filter sections substantially matches the target gain value for each control frequency. Processing device 2515 can be arranged to apply the filter to the input signal to provide the output audio signal.

Figure 26:
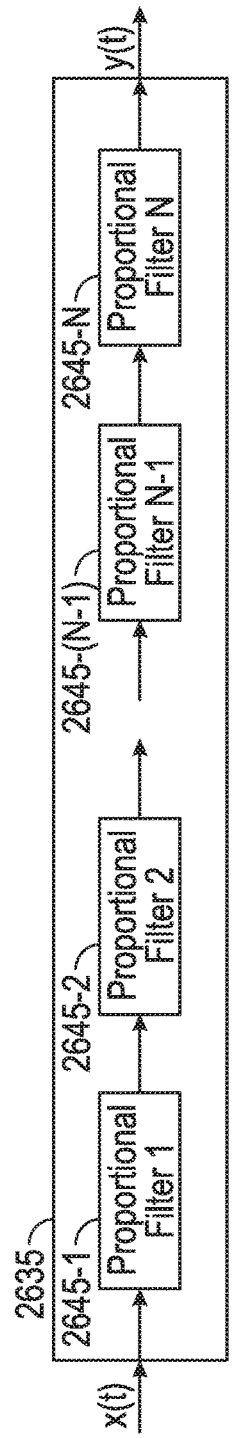
FIG. 26 is a schematic representation of a cascaded filter generated by the processing device of FIG. 25, in accordance with various embodiments.

FIG. 26 is a schematic representation of a filter 2635 generated by the processing device 2515. Filter 2635 operates on an input signal x(t) providing an output audio signal y(t). As discussed above, filter 2635 can include a number of proportional filter sections 2645-1, 2645-2 . . . 2645-(N−1), 2645-N cascaded together. One or more of the proportional filter sections 2645-1, 2645-2 . . . 2645-(N−1), 2645-N may be realized by a peaking filter section, a shelving filter section, or combination of peaking filter sections and shelving filter sections. Filter 2635 including the proportional filter sections arranged as cascaded filter sections can include a low shelving filter and a high shelving filter cascaded with peaking filter sections.

Processing device 2515 of system 2500 of FIG. 25 can be arranged to: set a quality factor for each of the peaking filter sections; and iteratively tune the quality factors by setting two adjacent control values to a same gain setting and all others to zero and adjusting a shared Q factor for the two adjacent control values such that response between the two frequencies is as flat as possible.

Processing device 2515 can be arranged to match the target gain value for each control frequency by multiplication of a vector of the target gain parameter values with a matrix derived from the magnitude frequency response values of the proportional filter sections at each control frequency, obtained for a reference value of the filter gain setting of each proportional filter section.

Processing device 2515 can be arranged to: select a plurality of delay units for a digital reverberator having a reverberation decay time, each delay unit having a delay length; generate a set of multi-band equalizers for the digital reverberator, each multi-band equalizer corresponding to a delay unit and having a target gain parameter value at each control frequency proportional to a corresponding delay length and inversely proportional to the reverberation decay time at the respective control frequency; and cascade each delay unit of the plurality of delay units with the corresponding multi-band equalizer of the set of multi-band equalizers. Processing device 2515 can be arranged to generate the set of multi-band equalizers to include variation of the target gain parameter values of the set of multi-band equalizers proportionally in response to scaling of the reverberation decay time.

Processing device 2515 can be arranged to modify the filter including the proportional filter sections and the application of the filter, the processor arranged to: compute a median gain offset, expressed in dB, and subtract the median gain offset from each target gain parameter value; calculate the filter gain setting for each of the proportional filter sections with respect to the target gain parameter value less the median gain offset for each control frequency; and apply the filter and the median gain offset to the input signal to provide the output audio signal.

Processing device 2515 can be arranged to: model a plurality of multi-band equalizers having a common set of control frequencies; simulate combination of the multi-band equalizers of the plurality of multi-band equalizers by addition of their target gain parameter values for each control frequency; apply the resulting composite gains to generate a single multi-band equalizer that replaces a cascade of the plurality of multi-band equalizers, wherein generation of the single multi-band equalizer includes generation of the filter including the proportional filter sections arranged as cascaded filter sections from selection of the common set of control frequencies as the plurality of control frequencies;

and apply the filter of the single multi-band equalizer to the input signal to provide the output audio signal.

III. Alternate Embodiments and Exemplary Operating Environment

Many other variations than those described herein will be apparent from the teachings herein. For example, depending on the embodiment, certain acts, events, or functions of any of the methods and algorithms described herein can be performed in a different sequence, can be added, merged, or left out altogether (such that not all described acts or events are necessary for the practice of the methods and algorithms). Moreover, in certain embodiments, acts or events can be performed concurrently, such as through multi-threaded processing, interrupt processing, or multiple processors or processor cores or on other parallel architectures, rather than sequentially. In addition, different tasks or processes can be performed by different machines and computing systems that can function together.

The various illustrative logical blocks, modules, methods, and algorithm processes and sequences described in connection with the embodiments disclosed herein can be implemented as electronic hardware, computer software, or combinations of both. To clearly illustrate this interchangeability of hardware and software, various illustrative components, blocks, modules, and process actions have been described above generally in terms of their functionality. Whether such functionality is implemented as hardware or software depends upon the particular application and design constraints imposed on the overall system. The described functionality can be implemented in varying ways for each particular application, but such implementation decisions should not be interpreted as causing a departure from the scope of this document.

The various illustrative logical blocks and modules described in connection with embodiments taught herein can be implemented or performed by a machine having a processing device, such as a general purpose processor, a computing device having one or more processing devices, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor and processing device can be a microprocessor, but in the alternative, the processor can be a controller, microcontroller, or state machine, combinations of the same, or the like. A processor or processing device can also be implemented as a combination of computing devices, such as a combination of a DSP and a microprocessor, a plurality of microprocessors, one or more microprocessors in conjunction with a DSP core, or any other such configuration.

Embodiments of audio spectral correction systems and methods taught herein can be operational within numerous types of general purpose or special purpose computing system environments or configurations. In general, a computing environment can include any type of computer system, including, but not limited to, a computer system based on one or more microprocessors, a mainframe computer, a digital signal processor, a portable computing device, a personal organizer, a device controller, a computational engine within an appliance, a mobile phone, a desktop computer, a mobile computer, a tablet computer, a smartphone, and appliances with an embedded computer, to name a few.

Such computing devices can be typically be found in devices having at least some minimum computational capability, including, but not limited to, personal computers, server computers, hand-held computing devices, laptop or mobile computers, communications devices such as cell phones and PDA's, multiprocessor systems, microprocessor-based systems, set top boxes, programmable consumer electronics, network PCs, minicomputers, mainframe computers, audio or video media players, and so forth. In some embodiments the computing devices will include one or more processors. Each processor may be a specialized microprocessor, such as a digital signal processor (DSP), a very long instruction word (VLIW), or other microcontroller, or can be conventional central processing units (CPUs) having one or more processing cores, including specialized graphics processing unit (GPU)-based cores in a multi-core CPU.

The process actions of a method, process, or algorithm described in connection with embodiments taught herein can be embodied directly in hardware, in a software module executed by a processor, or in any combination of the two. The software module can be contained in machine-readable media that can be accessed by a processing device such as contained in machine-readable storage device, for example, computer-readable media that can be accessed by a computing device. The computer-readable media can include both volatile and nonvolatile media that is either removable, non-removable, or some combination thereof. The computer-readable media is used to store information such as computer-readable or computer-executable instructions, data structures, program modules, or other data. By way of example, and not limitation, computer readable media may comprise computer storage media and communication media.

Machine-readable storage devices, such as computer storage media, can include, but is not limited to, computer or machine readable media or storage devices such as Bluray discs (BD), digital versatile discs (DVDs), compact discs (CDs), floppy disks, tape drives, hard drives, optical drives, solid state memory devices, RAM memory, ROM memory, EPROM memory, EEPROM memory, flash memory or other memory technology, magnetic cassettes, magnetic tapes, magnetic disk storage, or other magnetic storage devices, or any other device which can be used to store the desired information and which can be accessed by one or more processing devices such as computing devices.

A software module can reside in RAM memory, flash memory, ROM memory, EPROM memory, EEPROM memory, registers, hard disk, a removable disk, a CDROM, or any other form of non-transitory computer-readable storage medium, media, or physical computer storage known in the art. An exemplary storage medium can be coupled to a processor such that the processor can read information from, and write information to, the storage medium. In the alternative, the storage medium can be integral to the processor. The processor and the storage medium can reside in an application specific integrated circuit (ASIC). The ASIC can reside in a user terminal. Alternatively, the processor and the storage medium can reside as discrete components in a user terminal.

The phrase "non-transitory" as used herein means "enduring or long-lived". The phrase "non-transitory computer-readable media" includes any and all computer-readable media, with the sole exception of a transitory, propagating signal. This includes, by way of example and not limitation, non-transitory computer-readable media such as register memory, processor cache and random-access memory (RAM).

The phrase "audio signal" is a signal that is representative of a physical sound.

Retention of information such as computer-readable or computer-executable instructions, data structures, program modules, and no forth, can also be accomplished by using a variety of the communication media to encode one or more modulated data signals, electromagnetic waves (such as carrier waves), or other transport mechanisms or communications protocols, and includes any wired or wireless information delivery mechanism. In general, these communication media refer to a signal that has one or more of its characteristics set or changed in such a manner as to encode information or instructions in the signal. For example, communication media includes wired media such as a wired network or direct-wired connection carrying one or more modulated data signals, and wireless media such as acoustic, radio frequency (RF), infrared, laser, and other wireless media for transmitting, receiving, or both, one or more modulated data signals or electromagnetic waves. Combinations of the any of the above should also be included within the scope of communication media.

Further, one or any combination of software, programs, computer program products that embody some or all of the various embodiments of the audio spectral correction system and method described herein, or portions thereof, may be stored, received, transmitted, or read from any desired combination of computer or machine readable media or storage devices and communication media in the form of computer executable instructions or other data structures.

Embodiments of audio spectral correction systems and methods as taught herein may be further described in the general context of computer-executable instructions, such as program modules, being executed by a computing device. Generally, program modules include routines, programs, objects, components, data structures, and so forth, which perform particular tasks or implement particular abstract data types. The embodiments described herein may also be practiced in distributed computing environments where tasks are performed by one or more remote processing devices, or within a cloud of one or more devices, that are linked through one or more communications networks. In a distributed computing environment, program modules may be located in both local and remote computer storage media including media storage devices. Still further, the aforementioned instructions may be implemented, in part or in whole, as hardware logic circuits, which may or may not include a processor.

Conditional language used herein, such as, among others, "can," "might," "may," "e.g.," and the like, unless specifically stated otherwise, or otherwise understood within the context as used, is generally intended to convey that certain embodiments include certain features, elements and/or states. Thus, such conditional language is not generally intended to imply that features, elements and/or states are in any way required for one or more embodiments or that one or more embodiments necessarily include logic for deciding, with or without a input or prompting, whether these features, elements and/or states are included or are to be performed in any particular embodiment. The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list.

While the above detailed description has shown, described, and pointed out novel features as applied to various embodiments, it will be understood that various omissions, substitutions, and changes in the form and details of the devices or algorithms illustrated can be made without departing from the spirit of the disclosure. As will be recognized, certain embodiments of the inventions described herein can be embodied within a form that does not provide all of the features and benefits set forth herein, as some features can be used or practiced separately from others.

Moreover, although the subject matter has been described in language specific to structural features and methodological acts, it is to be understood that the subject matter defined in the appended claims is not necessarily limited to the specific features or acts described above. Rather, the specific features and acts described above are disclosed as example forms of implementing the claims.

What is claimed is:

1. A method comprising:
  selecting a plurality of control frequencies for an audio equalizer in a digital domain;
  for each control frequency of the plurality of control frequencies,
    setting a target gain;
    associating a proportional filter section; and
    determining a magnitude frequency response value of each proportional filter section using a prototype gain and populating a matrix with the magnitude frequency response value;
  inverting the matrix to generate a gain correction matrix having a correction factor for each proportional filter section;
  calculating a filter gain setting for each of the proportional filter sections, using the respective correction factor, such that a magnitude frequency response of a filter including the proportional filter sections arranged as cascaded filter sections substantially matches the target gain for each control frequency; and
  applying the filter to an input signal to provide an output audio signal.

2. The method of claim 1, wherein the proportional filter sections include peaking filter sections and/or shelving filter sections.

3. The method of claim 2, wherein the method includes setting a quality factor for each of the peaking filter sections.

4. The method of claim 3, wherein setting the quality factor for the peaking filter sections includes iteratively tuning the quality factors.

5. The method of claim 1, wherein the method includes providing the filter gain setting for each of the proportional filter sections equal to a product of the correction factor and the prototype gain for the respective proportional filter section.

6. The method of claim 1, wherein the method includes forming the filter including the proportional filter sections arranged as cascaded filter sections to include a low shelving filter and a high shelving filter cascaded with peaking filter sections.

7. The method of claim 1, wherein the method includes modifying the filter including the proportional filter sections and the application of the filter by
  computing a median gain offset, expressed in dB, and subtracting the median gain offset from each target gain;

calculating the filter gain setting for each of the proportional filter sections with respect to the target gain less the median gain offset for each control frequency; and
applying the filter and the median gain offset to the input signal to provide the output audio signal.

8. A method comprising:
selecting a plurality of control frequencies for an audio equalizer;
for each control frequency of the plurality of control frequencies,
setting a target gain;
associating a proportional filter section; and
determining a magnitude frequency response value of each proportional filter section;
calculating a filter gain setting for each of the proportional filter sections, using the magnitude frequency response values of the proportional filter sections, such that a magnitude frequency response of a filter including the proportional filter sections arranged as cascaded filter sections substantially matches the target gain for each control frequency; and
applying the filter to an input signal to provide an output audio signal, wherein the proportional filter sections include peaking filter sections and/or shelving filter sections and the method includes setting a quality factor for each of the peaking filter sections, wherein setting the quality factor for the peaking filter sections includes iteratively tuning the quality factors and iteratively tuning the quality factors includes:
setting two adjacent control frequencies to a same gain setting and all others to zero; and
adjusting a shared Q factor for the two adjacent control frequencies such that response between the two frequencies is as flat as possible.

9. The method of claim 8, wherein setting the quality factor includes setting the quality factor to 0.52 for a 5-band equalizer and to 0.98 for a 10-band equalizer.

10. A method comprising:
selecting a plurality of control frequencies for an audio equalizer;
for each control frequency of the plurality of control frequencies,
setting a target gain;
associating a proportional filter section; and
determining a magnitude frequency response value of each proportional filter section;
calculating a filter gain setting for each of the proportional filter sections, using the magnitude frequency response values of the proportional filter sections, such that a magnitude frequency response of a filter including the proportional filter sections arranged as cascaded filter sections substantially matches the target gain for each control frequency; and
applying the filter to an input signal to provide an output audio signal, wherein the method includes:
selecting a plurality of delay units for a digital reverberator having a reverberation decay time, each delay unit having a delay length;
forming a set of multi-band equalizers for the digital reverberator, each multi-band equalizer corresponding to a delay unit and having a target gain at each control frequency proportional to a corresponding delay length and inversely proportional to the reverberation decay time at the respective control frequency; and
cascading each delay unit of the plurality of delay units with the corresponding multi-band equalizer of the set of multi-band equalizers.

11. The method of claim 10, wherein generating the set of multi-band equalizers includes varying the target gains of the set of multi-band equalizers proportionally in response to scaling of the reverberation decay time.

12. A method comprising:
selecting a plurality of control frequencies for an audio equalizer;
for each control frequency of the plurality of control frequencies,
setting a target gain;
associating a proportional filter section; and
determining a magnitude frequency response value of each proportional filter section;
calculating a filter gain setting for each of the proportional filter sections, using the magnitude frequency response values of the proportional filter sections, such that a magnitude frequency response of a filter including the proportional filter sections arranged as cascaded filter sections substantially matches the target gain for each control frequency; and
applying the filter to an input signal to provide an output audio signal, wherein the method includes:
modeling a plurality of multi-band equalizers having a common set of control frequencies;
simulating combination of the multi-band equalizers of the plurality of multi-band equalizers by adding their target gains for each control frequency;
applying the resulting composite gains in generating a single multi-band equalizer that replaces a cascade of the plurality of multi-band equalizers, wherein generating the single multi-band equalizer includes generating the filter including the proportional filter sections arranged as cascaded filter sections from selecting the common set of control frequencies as the plurality of control frequencies; and
applying the filter of the single multi-band equalizer to the input signal to provide the output audio signal.

13. The method of claim 12, wherein the method includes forming the filter including the proportional filter sections arranged as cascaded filter sections to include a low shelving filter and a high shelving filter cascaded with the proportional filter sections.

14. The method of claim 12, wherein the filter of the single multi-band equalizer including the proportional filter sections arranged as cascaded filter sections includes the filter modified by computing a median gain offset and subtracting the median gain offset from each target gain for each control frequency in generating the proportional filter sections; and applying the modified filter of the single multi-band equalizer to the input signal includes applying the median gain offset to the input signal to provide the output audio signal.

15. An audio system comprising:
an input device; and
a processing device operatively coupled to the input device to receive an input signal and to operate on the input signal to control generation of an output audio signal from the input signal, the processing device arranged to
select a plurality of control frequencies for an audio equalizer in a digital domain;

for each control frequency of the plurality of control frequencies,
  set a target gain;
  associate a proportional filter section; and
  determine a magnitude frequency response value of each proportional filter section by use of a prototype gain and populate a matrix with the magnitude frequency response value;
invert the matrix to generate a gain correction matrix having a correction factor for each proportional filter section;
calculate a filter gain setting for each of the proportional filter sections; using the respective correction factor, such that a magnitude frequency response of a filter including the proportional filter sections arranged as cascaded filter sections substantially matches the target gain for each control frequency; and
  apply the filter to the input signal to provide the output audio signal.

16. The audio system of claim 15, wherein the proportional filter sections include peaking filter sections and/or shelving filter sections.

17. The audio system of claim 15, wherein the processor is arranged to match provide the filter gain setting for each of the proportional filter sections equal to a product of the correction factor and the prototype gain for the respective proportional filter section.

18. The audio system of claim 15, wherein the filter including the proportional filter sections arranged as cascaded filter sections includes a low shelving filter and a high shelving filter cascaded with peaking filter sections.

19. The audio system of claim 15, wherein the processor is arranged to modify the filter including the proportional filter sections and the application of the filter, the processor arranged to
  compute a median gain offset, expressed in dB, and subtract the median gain offset from each target gain;
  calculate the filter gain setting for each of the proportional filter sections with respect to the target gain less the median gain offset for each control frequency; and
  apply the filter and the median gain offset to the input signal to provide the output audio signal.

20. An audio system comprising:
an input device; and
a processing device operatively coupled to the input device to receive an input signal and to operate on the input signal to control generation of an output audio signal from the input signal, the processing device arranged to
  select a plurality of control frequencies for an audio equalizer;
  for each control frequency of the plurality of control frequencies,
    set a target gain;
    associate a proportional filter section; and
    determine a magnitude frequency response value of each proportional filter section;
  calculate a filter gain setting for each of the proportional filter sections, using the magnitude frequency response values of the proportional filter sections, such that a magnitude frequency response of a filter including the proportional filter sections arranged as cascaded filter sections substantially matches the target gain for each control frequency; and
  apply the filter to the input signal to provide the output audio signal, wherein the proportional filter sections include peaking filter sections and/or shelving filter sections, wherein the processing device is arranged to:
    set a quality factor for each of the peaking filter sections; and
    iteratively tune the quality factors by setting two adjacent control frequencies to a same setting and all others to zero and adjusting a shared Q factor for the two adjacent control frequencies such that response between the two frequencies is as flat as possible.

21. An audio system comprising:
an input device; and
a processing device operatively coupled to the input device to receive an input signal and to operate on the input signal to control generation of an output audio signal from the input signal, the processing device arranged to
  select a plurality of control frequencies for an audio equalizer;
  for each control frequency of the plurality of control frequencies,
    set a target gain;
    associate a proportional filter section; and
    determine a magnitude frequency response value of each proportional filter section;
  calculate a filter gain setting for each of the proportional filter sections, using the magnitude frequency response values of the proportional filter sections, such that a magnitude frequency response of a filter including the proportional filter sections arranged as cascaded filter sections substantially matches the target gain for each control frequency; and
  apply the filter to the input signal to provide the output audio signal, wherein the processor is arranged to:
    select a plurality of delay units for a digital reverberator having a reverberation decay time, each delay unit having a delay length;
    generate a set of multi-band equalizers for the digital reverberator, each multi-band equalizer corresponding to a delay unit and having a target gain at each control frequency proportional to a corresponding delay length and inversely proportional to the reverberation decay time at the respective control frequency; and
    cascade each delay unit of the plurality of delay units with the corresponding multi-band equalizer of the set of multi-band equalizers.

22. The audio system of claim 21, wherein the processor is arranged to generate the set of multi-band equalizers to include variation of the target gains of the set of multi-band equalizers proportionally in response to scaling of the reverberation decay time.

23. An audio system comprising:
an input device; and
a processing device operatively coupled to the input device to receive an input signal and to operate on the input signal to control generation of an output audio signal from the input signal, the processing device arranged to
  select a plurality of control frequencies for an audio equalizer;

for each control frequency of the plurality of control frequencies,
set a target gain;
associate a proportional filter section; and
determine a magnitude frequency response value of each proportional filter section;
calculate a filter gain setting for each of the proportional filter sections, using the magnitude frequency response values of the proportional filter sections, such that a magnitude frequency response of a filter including the proportional filter sections arranged as cascaded filter sections substantially matches the target gain for each control frequency; and
apply the filter to the input signal to provide the output audio signal, wherein the processor is arranged to:
model a plurality of multi-band equalizers having a common set of control frequencies;
simulate combination of the multi-band equalizers of the plurality of multi-band equalizers by addition of their target gains for each control frequency;
apply the resulting composite gains to generate a single multi-band equalizer that replaces a cascade of the plurality of multi-band equalizers, wherein generation of the single multi-band equalizer includes generation of the filter including the proportional filter sections arranged as cascaded filter sections from selection of the common set of control frequencies as the plurality of control frequencies; and
apply the filter of the single multi-band equalizer to the input signal to provide the output audio signal.

24. A non-transitory machine-readable storage device having instructions stored thereon, which, when executed by a processor of a machine, cause the machine to perform operations, the operations comprising:
selecting a plurality of control frequencies for an audio equalizer in a digital domain;
for each control frequency of the plurality of control frequencies, setting a target gain;
associating a proportional filter section; and
determining a magnitude frequency response value of each proportional filter section using a prototype gain and populating a matrix with the magnitude frequency response value;
inverting the matrix to generate a gain correction matrix having a correction factor for each proportional filter section;
calculating a filter gain setting for each of the proportional filter sections, using the respective correction factor, such that a magnitude frequency response of a filter including the proportional filter sections arranged as cascaded filter sections substantially matches the target gain for each control frequency; and
applying the filter to an input signal to provide an output audio signal.

25. The non-transitory machine-readable storage device of claim 24, wherein the operations include providing the filter gain setting for each of the proportional filter sections equal to a product of the factor correction factor and the prototype gain for the respective proportional filter section.

26. The non-transitory machine-readable storage device of claim 24, wherein the operations include forming the filter including the proportional filter sections arranged as cascaded filter sections to include a low shelving filter and a high shelving filter cascaded with peaking filter sections.

27. The non-transitory machine-readable storage device of claim 24, wherein the operations include modifying the filter including the proportional filter sections and the application of the filter by
computing a median gain offset, expressed in dB, and subtracting the median gain offset from each target gain;
calculating the filter gain setting for each of the proportional filter sections with respect to the target gain less the median gain offset for each control frequency; and
applying the filter and the median gain offset to the input signal to provide the output audio signal.

28. A non-transitory machine-readable storage device having instructions stored thereon, which, when executed by a processor of a machine, cause the machine to perform operations, the operations comprising:
selecting a plurality of control frequencies for an audio equalizer;
for each control frequency of the plurality of control frequencies,
setting a target gain;
associating a proportional filter section; and
determining a magnitude frequency response value of each proportional filter section;
calculating a filter gain setting for each of the proportional filter sections, using the magnitude frequency response values of the proportional filter sections, such that a magnitude frequency response of a filter including the proportional filter sections arranged as cascaded filter sections substantially matches the target gain for each control frequency; and
applying the filter to an input signal to provide an output audio signal, wherein the proportional filter sections include peaking filter sections and the operations include setting a quality factor for each of the peaking filter sections; and
iteratively tuning the quality factors by setting two adjacent control frequencies to a same gain setting and all others to zero, and adjusting a shared Q factor for the two adjacent control frequencies such that response between the two frequencies is as flat as possible.

29. A non-transitory machine-readable storage device having instructions stored thereon, which, when executed by a processor of a machine, cause the machine to perform operations, the operations comprising:
selecting a plurality of control frequencies for an audio equalizer;
for each control frequency of the plurality of control frequencies,
setting a target gain;
associating a proportional filter section; and
determining a magnitude frequency response value of each proportional filter section;
calculating a filter gain setting for each of the proportional filter sections, using the magnitude frequency response values of the proportional filter sections, such that a magnitude frequency response of a filter including the proportional filter sections arranged as cascaded filter sections substantially matches the target gain for each control frequency; and
applying the filter to an input signal to provide an output audio signal, wherein the operations include:
selecting a plurality of delay units for a digital reverberator having a reverberation decay time, each delay unit having a delay length;
forming a set of multi-band equalizers for the digital reverberator, each multi-band equalizer corresponding to a delay unit and having a target gain at each control frequency proportional to a corresponding delay length and inversely proportional to the reverberation decay time at the respective control frequency; and cascading each delay unit of the plurality of delay units with the corresponding multi-band equalizer of the set of multi-band equalizers.

30. A non-transitory machine-readable storage device having instructions stored thereon, which, when executed by a processor of a machine, cause the machine to perform operations, the operations comprising:

selecting a plurality of control frequencies for an audio equalizer;

for each control frequency of the plurality of control frequencies,
setting a target gain;
associating a proportional filter section; and
determining a magnitude frequency response value of each proportional filter section;

calculating a filter gain setting for each of the proportional filter sections, using the magnitude frequency response values of the proportional filter sections, such that a magnitude frequency response of a filter including the proportional filter sections arranged as cascaded filter sections substantially matches the target gain for each control frequency; and applying the filter to an input signal to provide an output audio signal, wherein the operations include:
modeling a plurality of multi-band equalizers having a common set of control frequencies;
simulating combination of the multi-band equalizers of the plurality of multi-band equalizers by adding their target gains for each control frequency;
applying the resulting composite gains in generating a single multi-band equalizer that replaces a cascade of the plurality of multi-band equalizers, wherein generating the single multi-band equalizer includes generating the filter including the proportional filter sections arranged as cascaded filter sections from selecting the common set of control frequencies as the plurality of control frequencies; and
applying the filter of the single multi-band equalizer to the input signal to provide the output audio signal.

* * * * *

UNITED STATES PATENT AND TRADEMARK OFFICE
CERTIFICATE OF CORRECTION

| | | |
|---|---|---|
| PATENT NO. | : 10,243,534 B2 | Page 1 of 1 |
| APPLICATION NO. | : 15/337006 | |
| DATED | : March 26, 2019 | |
| INVENTOR(S) | : Jot et al. | |

It is certified that error appears in the above-identified patent and that said Letters Patent is hereby corrected as shown below:

In the Claims

In Column 22, Line 64, in Claim 7, after "by", insert --:--

In Column 24, Line 65, in Claim 15, after "to", insert --:--

In Column 25, Line 13, in Claim 15, delete "sections;" and insert --sections,-- therefor In Column 25, Line 36, in Claim 19, after "to", insert --:--

In Column 25, Line 50, in Claim 20, after "to", insert --:--

In Column 26, Line 19, in Claim 21, after "to", insert --:--

In Column 26, Line 65, in Claim 23, after "to", insert --:--

In Column 27, Line 31, in Claim 23, delete "multi-hand" and insert --multi-band-- therefor In Column 28, Line 4, in Claim 27, after "by", insert --:--

Signed and Sealed this
Twenty-eighth Day of April, 2020

Andrei Iancu
*Director of the United States Patent and Trademark Office*